US012756367B2

(12) United States Patent
Tahara et al.

(10) Patent No.: US 12,756,367 B2
(45) Date of Patent: Oct. 6, 2026

(54) POWER AMPLIFIER CIRCUIT AND POWER AMPLIFICATION METHOD

(71) Applicant: Murata Manufacturing Co., Ltd., Nagaokakyo (JP)

(72) Inventors: Kenji Tahara, Nagaokakyo (JP); Ryo Wakabayashi, Nagaokakyo (JP); Kae Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 415 days.

(21) Appl. No.: 18/434,907

(22) Filed: Feb. 7, 2024

(65) Prior Publication Data

US 2024/0178804 A1 May 30, 2024

Related U.S. Application Data

(63) Continuation of application No. PCT/JP2022/029746, filed on Aug. 3, 2022.

(30) Foreign Application Priority Data

Aug. 13, 2021 (JP) ................................ 2021-131967

(51) Int. Cl.
*H03F 1/02* (2006.01)
*H03F 3/24* (2006.01)

(52) U.S. Cl.
CPC ........ *H03F 3/245* (2013.01); *H03F 2200/315* (2013.01); *H03F 2200/451* (2013.01)

(58) Field of Classification Search
CPC ...... H03F 1/0288; H03F 1/0233; H03F 3/211; H03F 2200/102; H03F 2200/451
(Continued)

(56) References Cited

U.S. PATENT DOCUMENTS 7,548,134 B2 * 6/2009 Park .......................... H01P 5/02 333/24 R
2004/0008082 A1 * 1/2004 Dow ......................... H03F 1/14 330/51
(Continued)

FOREIGN PATENT DOCUMENTS

JP 2002-359531 A 12/2002
JP 2006-295896 A 10/2006
(Continued)

OTHER PUBLICATIONS

International Search Report and Written Opinion mailed on Nov. 1, 2022, received for PCT Application PCT/JP2022/029746, filed on Aug. 3, 2022, 12 pages including English Translation.

*Primary Examiner* — Hafizur Rahman
(74) *Attorney, Agent, or Firm* — XSENSUS LLP

(57) ABSTRACT

The power amplifier circuit includes an amplifier element, a transmission line transformer (TLT) circuit including a first, second and third line, and a switching circuit including a first, second, and third terminal. One end of the first line is coupled to an output terminal of the amplifier element, and the other end of the first line is coupled to one end of the second line. The other end of the second line is coupled to the terminal. One end of the third line is coupled between the one end of the first line and the output terminal of the amplifier element. The other end of the third line is coupled to the terminal. The switching circuit includes a first switch provided between the terminal and ground and a second switch provided between the terminal and ground.

20 Claims, 19 Drawing Sheets

(58) Field of Classification Search
USPC .............................................. 330/124 R, 295
See application file for complete search history.

(56) References Cited

U.S. PATENT DOCUMENTS

| | | | | |
|---|---|---|---|---|
| 2014/0295781 | A1* | 10/2014 | Kawano .................. | H03F 3/245 455/127.2 |
| 2017/0076855 | A1 | 3/2017 | Roberg | |
| 2018/0183396 | A1* | 6/2018 | Komiak .................... | H03F 3/60 |
| 2020/0021024 | A1* | 1/2020 | Park ..................... | H04B 1/0475 |

FOREIGN PATENT DOCUMENTS

| | | | | | |
|---|---|---|---|---|---|
| JP | 2019-153959 | A | | 9/2019 | |
| JP | 2020-038957 | A | | 3/2020 | |
| JP | 2021-052376 | A | | 4/2021 | |
| KR | 20200026713 | A | * | 3/2020 | ......... H01F 17/0013 |

* cited by examiner

POWER AMPLIFIER CIRCUIT AND POWER AMPLIFICATION METHOD

CROSS-REFERENCE TO RELATED APPLICATIONS

This is a continuation application of PCT/JP2022/029746, filed on Aug. 3, 2022, designating the United States of America, which is based on and claims priority to Japanese Patent Application No. JP 2021-131967 filed on Aug. 13, 2021. The entire contents of the above-identified applications, including the specifications, drawings and claims, are incorporated herein by reference in their entirety.

TECHNICAL FIELD

The present disclosure relates to power amplifier circuits and power amplification methods.

BACKGROUND ART

Patent Document 1 discloses a power amplifier using a transmission line transformer. The transmission line transformer disclosed in Patent Document 1 includes two primary transmission lines and one secondary transmission line, which are coupled to the output terminal of an amplifier element.

CITATION LIST

Patent Document

Patent Document 1: Japanese Unexamined Patent Application Publication No. 2006-295896

SUMMARY OF DISCLOSURE

Technical Problem

However, the known power amplifier has a problem of inadequate efficiency due to the fixed impedance of the transmission line transformer.

The present disclosure provides a power amplifier circuit and a power amplification method with improved efficiency.

Solution to Problem

A power amplifier circuit according to an aspect of the present disclosure includes an amplifier element, a transmission line transformer (TLT) circuit including a first line, a second line, and a third line, and a switching circuit including a first terminal, a second terminal, and a third terminal. One end of the first line is coupled to an output terminal of the amplifier element. The other end of the first line is coupled to one end of the second line. The other end of the second line is coupled to the first terminal. One end of the third line is coupled between the one end of the first line and the output terminal of the amplifier element. The other end of the third line is coupled to the second terminal. The third terminal is configured to be coupled to at least one of the first terminal and the second terminal. The switching circuit includes a first switch provided between the first terminal and ground and a second switch provided between the second terminal and ground.

A power amplification method according to an aspect of the present disclosure includes switching between a first mode and a second mode and performing the first mode or the second mode. The first mode is configured such that, using a TLT circuit that includes a first line with one end coupled to an output terminal of the amplifier element, a second line with one end coupled to the other end of the first line, and a third line with one end coupled between the one end of the first line and the output terminal of the amplifier element, while the other end of the third line is coupled to ground, the amplifier element amplifies a radio-frequency signal, and the amplified radio-frequency signal is output from the other end of the second line. The second mode is configured such that, while the other end of the second line is coupled to ground, the amplifier element amplifies a radio-frequency signal, and the amplified radio-frequency signal is output from the other end of the third line.

Advantageous Effects of Disclosure

The power amplifier circuit and the power amplification method according to the present disclosure improve efficiency.

DESCRIPTION OF EMBODIMENTS

Figure 1:
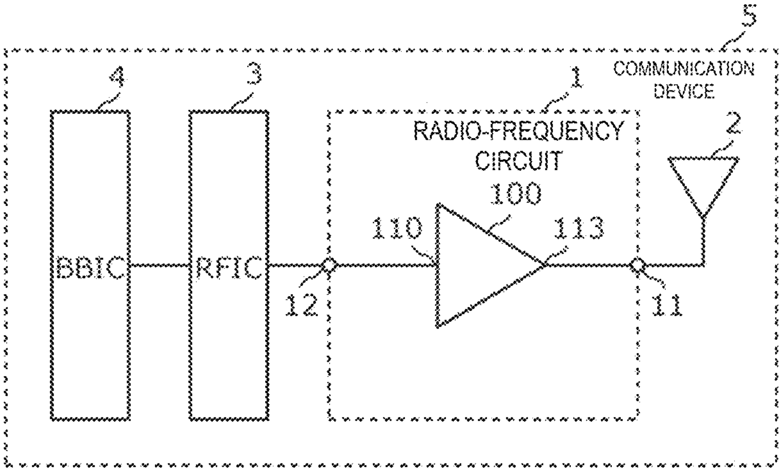
FIG. 1 illustrates a configuration of a communication device according to a first embodiment.

Hereinafter, power amplifier circuits and power amplification methods according to embodiments of the present disclosure will be described in detail with reference to the drawings. Each embodiment described below represents one specific example of the present disclosure. Thus, details such as numerical values, shapes, materials, constituent elements, arrangements and connection modes of the constituent elements, steps, and the order of the steps that are provided in the following embodiments are illustrative and are not intended to limit the present disclosure. Among the constituent elements in the following embodiments, constituent elements not recited in any of the independent claims are described as arbitrary constituent elements.

The drawings are schematic drawings and are not necessarily illustrated in an exact manner. Thus, for example, the drawings are not necessarily consistent in terms of, for example, scale. Identical reference numerals are assigned to substantially the same configuration elements across the drawings, and redundant descriptions of these configuration elements are omitted or simplified.

In this specification, terms describing relationships between elements, such as parallel, terms indicating an element's shape, such as rectangular, and numerical ranges are not meant to convey only precise meanings. These terms and numerical ranges denote meanings that are substantially the same, involving, for example, about several percent differences.

In the circuit configurations of the present disclosure, the term "coupled" applies assuming one circuit element is directly coupled to another circuit element via a connection terminal and/or a wiring conductor. The term also applies assuming one circuit element is electrically coupled to another circuit element via still another circuit element. The term "directly coupled" refers to a situation in which one circuit element is electrically coupled to another circuit element without the interposition of any other circuit elements. The term "coupled between A and B" refers to a situation in which one circuit element is positioned between A and B and coupled to both A and B. The term applies assuming the circuit element is coupled in series in the path connecting A and B and also assuming the circuit element is coupled (shunt-connected) between the path and ground.

The expression "a switch is provided between A and B" refers to a situation in which one end of the switch is coupled to A, and the other end of the switch is coupled to B. This means that assuming the switch is turned on, A and B are electrically continuous (connected state); assuming the switch is turned off, A and B are electrically discontinuous (open state).

As regards component arrangements in the present disclosure, the term "plan view of a module substrate" means equivalent to the term "plan view of a major surface of the module substrate"; the term "plan view of a module substrate" refers to a situation in which one object is viewed in a direction orthogonal to the major surface in the state in which the object is orthogonally projected onto the major surface. In this specification, unless otherwise specified, the term "plan view" refers to "plan view of a major surface of a module substrate."

The expression "a component is disposed at a major surface of a substrate" applies assuming the component is positioned on the major surface of the substrate in contact with the major surface, assuming the component is positioned above the major surface without making contact with the major surface, and also assuming the component is partially embedded in the substrate at the major surface. The expression "A overlaps B in plan view" refers to a situation in which the region of A that is orthogonally projected onto a major surface overlaps the region of B that is orthogonally projected onto the major surface.

In this specification, unless otherwise noted, ordinal numerals such as "first" and "second" do not indicate the number or order of constituent elements; the ordinal numerals are used for the purpose of avoiding confusion of constituent elements of the same type and distinguishing between the constituent elements.

In this specification, the term "transmit path" refers to a transfer line constituted by, for example, a wire to carry radio-frequency transmit signals, an electrode directly coupled to the wire, and a terminal directly coupled to the wire or electrode. The term "receive path" refers to a transfer line constituted by, for example, a wire to carry radio-frequency receive signals, an electrode directly coupled to the wire, and a terminal directly coupled to the wire or electrode. The term "transmit/receive path" refers to a transfer line constituted by, for example, a wire to carry both radio-frequency transmit signals and radio-frequency receive signals, an electrode directly coupled to the wire, and a terminal directly coupled to the wire or electrode.

First Embodiment

1.1 Configuration of Communication Device 5

First, a configuration of a communication device 5 according to a first embodiment will be described with reference to FIG. 1. FIG. 1 illustrates a configuration of the communication device 5 according to the present embodiment.

The communication device 5 can be used in communication systems. The communication device 5 is, for example, a mobile terminal such as a smartphone or tablet computer. As illustrated in FIG. 1, the communication device 5 includes a radio-frequency circuit 1, an antenna 2, a radio-frequency integrated circuit (RFIC) 3, and a baseband integrated circuit (BBIC) 4.

The radio-frequency circuit 1 is operable to transfer radio-frequency signals between the antenna 2 and the RFIC 3. The radio-frequency circuit 1 includes an antenna connection terminal 11 and a radio-frequency input terminal 12. The radio-frequency circuit 1 includes a power amplifier circuit 100 configured to amplify transmit signals. Transmit signals are an example of a radio-frequency signal. The specific configuration of the power amplifier circuit 100 will be described later.

The antenna connection terminal 11 is coupled to an external output terminal 113 of the power amplifier circuit 100 inside the radio-frequency circuit 1. The antenna connection terminal 11 is coupled to the antenna 2 outside the radio-frequency circuit 1. The transmit signal amplified by the power amplifier circuit 100 can be output to the antenna 2 through the antenna connection terminal 11.

The radio-frequency input terminal 12 is operable to receive transmit signals from outside the radio-frequency circuit 1. The radio-frequency input terminal 12 is coupled to an external input terminal 110 of the power amplifier circuit 100 inside the radio-frequency circuit 1. The radio-frequency input terminal 12 is coupled to the RFIC 3 outside the radio-frequency circuit 1. With this configuration, the transmit signal received from the RFIC 3 through the radio-frequency input terminal 12 can be supplied to the power amplifier circuit 100.

In the present embodiment, the radio-frequency circuit 1 is operable to transfer transmit signals. However, the radio-frequency circuit 1 may also be configured to transfer receive signals. Receive signals are an example of a radio-frequency signal. This means that the radio-frequency circuit 1 may include a transmit circuit for transferring transmit signals and a receive circuit for transferring receive signals. The radio-frequency circuit 1 may include a low-noise amplifier (LNA) for amplifying receive signals, a radio-frequency output terminal for outputting receive signals, a switch for controlling switching between transmit and receive paths, a filter, and an impedance matching circuit.

The antenna 2 is coupled to the antenna connection terminal 11 of the radio-frequency circuit 1. The antenna 2 is operable to transmit radio-frequency signals outputted from the radio-frequency circuit 1. The antenna 2 may be operable to receive radio-frequency signals from outside and output the radio-frequency signals to the radio-frequency circuit 1.

The RFIC 3 is an example of a signal processing circuit for processing radio-frequency signals. The RFIC 3 is coupled to the radio-frequency input terminal 12 of the radio-frequency circuit 1. Specifically, the RFIC 3 is operable to perform signal processing, for example up-conversion, on transmit signals inputted from the BBIC 4 and output the radio-frequency transmit signals generated by the signal processing to a transmit path in the radio-frequency circuit 1. The RFIC 3 may also be operable to perform signal processing, for example down-conversion, on radio-frequency receive signals inputted through a receive path in the radio-frequency circuit 1 and output the receive signals generated by the signal processing to the BBIC 4.

The BBIC 4 is a baseband signal processing circuit for performing signal processing using an intermediate frequency band that is lower than radio-frequency signals transferred by the radio-frequency circuit 1. Signals such as image signals for image display and/or sound signals for calls through speakers can be processed by the BBIC 4.

The circuit configuration of the communication device 5 illustrated in FIG. 1 is illustrative, and this is not to be interpreted as limiting. For example, the communication device 5 does not necessarily include the antenna 2 and/or the BBIC 4. The communication device 5 may include multiple antennas 2.

[1.2 Circuit Configuration of Power Amplifier Circuit 100]

Figure 2:
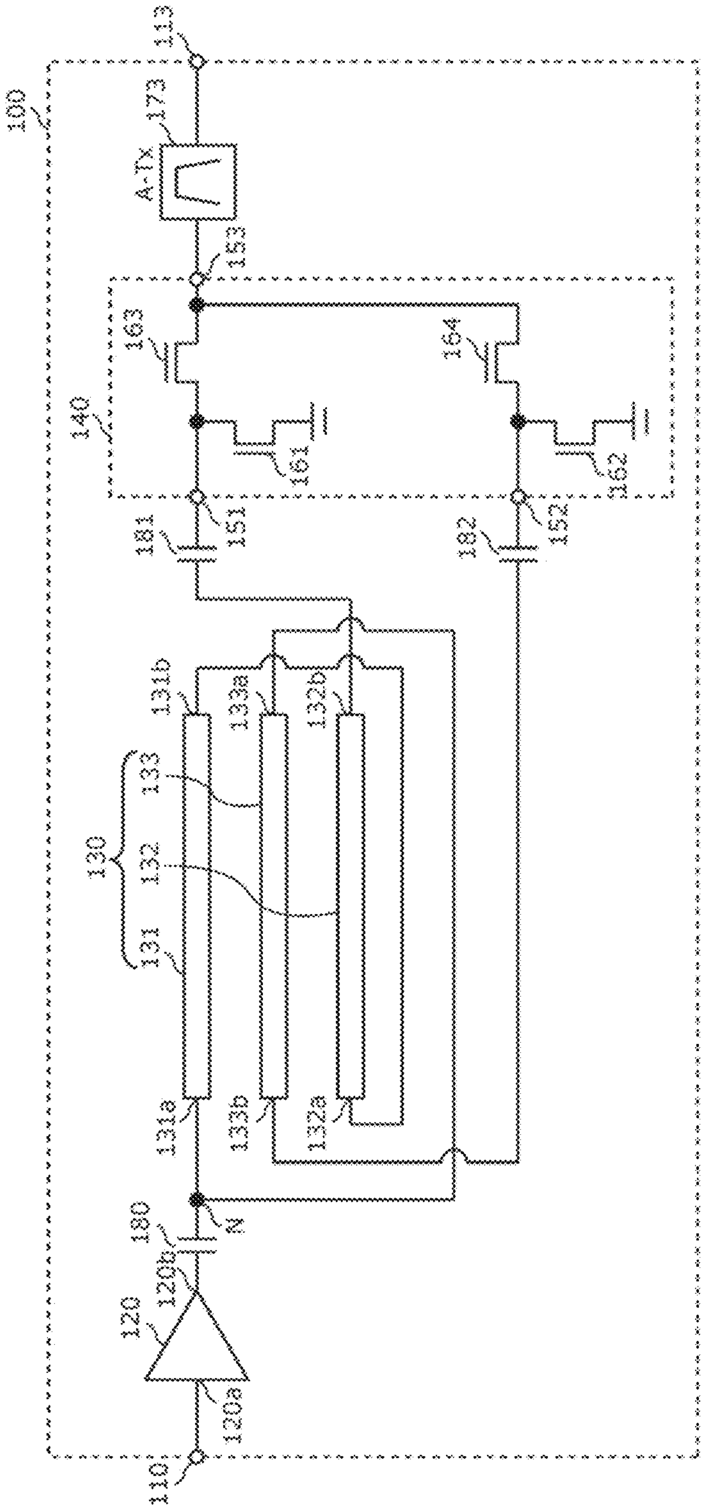
FIG. 2 is a circuit configuration diagram of a power amplifier circuit according to the first embodiment.

Next, a specific circuit configuration of the power amplifier circuit 100 will be described with reference to FIG. 2. FIG. 2 is a circuit configuration diagram of the power amplifier circuit 100 according to the present embodiment.

As illustrated in FIG. 2, the power amplifier circuit 100 includes an amplifier element 120, a transmission line transformer (TLT) circuit 130, a switching circuit 140, a filter 173, and capacitors 180, 181, and 182. As also illustrated in FIG. 1, the power amplifier circuit 100 includes the external input terminal 110 and the external output terminal 113.

The amplifier element 120 is operable to amplify transmit signals in a band A. The amplifier element 120 has an input terminal 120*a* and an output terminal 120*b*. The input terminal 120*a* is coupled to the external input terminal 110. The output terminal 120*b* is coupled to the TLT circuit 130 via the capacitor 180.

The amplifier element 120 includes, for example, a bipolar transistor (BJT: bipolar junction transistor) such as a heterojunction bipolar transistor (HBT). Alternatively, the amplifier element 120 may include a field-effect transistor (FET) such as a metal-oxide-semiconductor field-effect transistor (MOSFET). The amplifier element 120 may have a multistage configuration, including multiple BJTs or FETs.

The TLT circuit 130 is operable to transfer transmit signals amplified by the amplifier element 120. Specifically, the TLT circuit 130 includes a first line 131, a second line 132, and a third line 133. The third line 133 is provided between the first line 131 and the second line 132. The first line 131 and the second line 132 are electromagnetically coupleable to the third line 133. Electromagnetically coupleable refers to coupling via electric fields, magnetic fields, or electromagnetic fields.

One end 131*a* of the first line 131 is coupled to the output terminal 120*b* of the amplifier element 120. Specifically, the one end 131*a* of the first line 131 is coupled to the output terminal 120*b* of the amplifier element 120 via the capacitor 180.

The other end 131*b* of the first line 131 is coupled to one end 132*a* of the second line 132. The other end 132*b* of the second line 132 is coupled to a first terminal 151 of the switching circuit 140.

The first line 131 and the second line 132 are configured such that current flows in the same direction. Specifically, current flows in the first line 131 from the one end 131*a* to the other end 131*b*. Current flows in the second line 132 from the one end 132*a* to the other end 132*b*. The first line 131 and the second line 132 are formed by conductive wires provided at a module substrate, which will be described in detail later. The first line 131 extends from the one end 131*a* to the other end 131*b* in a direction that is substantially the same as the direction in which the second line 132 extends from the one end 132*a* to the other end 132*b*.

One end 133*a* of the third line 133 is coupled to a node N. The node N is positioned between the one end 131*a* of the first line 131 and the output terminal 120*b* of the amplifier element 120. Specifically, the node N is a branch point of signal paths. The other end 133*b* of the third line 133 is coupled to a second terminal 152 of the switching circuit 140.

The third line 133 and the first line 131 are configured such that current flows in opposite directions. Specifically, current flows in the third line 133 from the one end 133*a* to the other end 133*b*. Current flows in the first line 131 from the one end 131*a* to the other end 131*b*. The third line 133 extends from the one end 133*a* to the other end 133*b* in a direction that is substantially opposite to the direction in which the first line 131 extends from the one end 131*a* to the other end 131*b*. The same applies to the relationship between the third line 133 and the second line 132.

In the present embodiment, each of the first line 131, the second line 132, and the third line 133 has substantially the same wire length. Each of the first line 131, the second line 132, and the third line 133 has substantially the same wire width. The first line 131, the second line 132, and the third line 133 are positioned parallel to each other.

The switching circuit 140 includes the first terminal 151, the second terminal 152, and a third terminal 153. The switching circuit 140 includes a first switch 161, a second switch 162, a third switch 163, and a fourth switch 164.

The first terminal 151 and the second terminal 152 are input terminals for inputting the transmit signals that have been amplified by the amplifier element 120 and transferred through the TLT circuit 130. The third terminal 153 is an output terminal for outputting the transmit signals. The third terminal 153 can be coupled to at least one of the first terminal 151 and the second terminal 152. In the present embodiment, the third terminal 153 is selectively coupleable to the first terminal 151 or the second terminal 152. The third terminal 153 is a common terminal capable of establishing electrical continuity with each of the first terminal 151 and the second terminal 152.

The first switch 161 is provided between the first terminal 151 and ground. The first switch 161 is a shunt switch. Assuming the first switch 161 is turned on, the first terminal 151 is coupled to (electrically continuous with) ground. Assuming the first switch 161 is turned off, the first terminal 151 is disconnected from ground.

The second switch 162 is provided between the second terminal 152 and ground. The second switch 162 is a shunt switch. Assuming the second switch 162 is turned on, the second terminal 152 is coupled to (electrically continuous with) ground. Assuming the second switch 162 is turned off, the second terminal 152 is disconnected from ground.

The third switch 163 is provided between the first terminal 151 and the third terminal 153. The third switch 163 is a series switch. Assuming the third switch 163 is turned on, the first terminal 151 is coupled to (electrically continuous with) the third terminal 153. Assuming the third switch 163 is turned off, the first terminal 151 is disconnected from the third terminal 153.

The fourth switch 164 is provided between the second terminal 152 and the third terminal 153. The fourth switch 164 is a series switch. Assuming the fourth switch 164 is turned on, the second terminal 152 is coupled to (electrically continuous with) the third terminal 153. Assuming the fourth switch 164 is turned off, the second terminal 152 is disconnected from the third terminal 153.

The first switch 161, the second switch 162, the third switch 163, and the fourth switch 164 are controllable to turn on or off by a control circuit (not illustrated in the drawing). Specific controls for the switches will be described later. The first switch 161, the second switch 162, the third switch 163, and the fourth switch 164 are switching elements such as FETs or BJTs.

The filter 173 (A-Tx) has a pass band that includes the band A. Specifically, the filter 173 is a transmit filter with a pass band that includes an uplink operating band of the band A. The filter 173 is thus operable to pass transmit signals in the band A out of the transmit signals amplified by the amplifier element 120.

The band A is a frequency band for a communication system that is built using a radio access technology (RAT). The band A is defined by standardization organizations such as the 3rd Generation Partnership Project (3GPP) (registered trademark) and the Institute of Electrical and Electronics Engineers (IEEE). Examples of the communication system include a 5th Generation New Radio (5GNR) system, a Long Term Evolution (LTE) system, and a Wireless Local Area Network (WLAN) system.

The filter 173 is coupled between the third terminal 153 of the switching circuit 140 and the external output terminal 113. The filter 173 is not necessarily included in the power amplifier circuit 100. For example, the filter 173 may be coupled between the external output terminal 113 and the antenna connection terminal 11 (see FIG. 1).

In the case in which the radio-frequency circuit 1 is configured to transfer receive signals, the filter 173 may be a transmit filter included in a duplexer that enables frequency division duplex (FDD) using the band A. Alternatively, the filter 173 may be a transmit/receive filter that enables time division duplex (TDD).

The filter 173 may be implemented using, for example, any of a surface acoustic wave (SAW) filter, a bulk acoustic wave (BAW) filter, an LC resonance filter, and a dielectric filter. However, these examples are not to be interpreted as limiting.

The capacitor 180 is a direct-current (DC) blocking capacitor. The capacitor 180 is coupled in series between the output terminal 120*b* of the amplifier element 120 and the node N. In place of the capacitor 180, DC blocking capacitors may be individually provided between the node N and the one end 131*a* of the first line 131 and between the node N and the one end 133*a* of the third line 133.

The capacitor 181 is an example of a first capacitor. The capacitor 181 is coupled in series between the other end 132*b* of the second line 132 and the first terminal 151 of the switching circuit 140. The capacitor 181 is provided for the purpose of cancelling at least a portion of the parasitic inductance component that is generated in the path connecting the other end 132*b* of the second line 132 and the first terminal 151.

The capacitor 182 is an example of a second capacitor. The capacitor 182 is coupled in series between the other end 133*b* of the third line 133 and the second terminal 152 of the switching circuit 140. The capacitor 182 is provided for the purpose of cancelling at least a portion of the parasitic inductance component that is generated in the path connecting the other end 133*b* of the third line 133 and the second terminal 152.

[1.3 Operation]

Next, the operation of the power amplifier circuit 100 will be described.

The power amplifier circuit 100 has multiple operating modes. Specifically, the multiple operating modes include a first power mode and a second power mode. The first power mode corresponds to first output power. The second power mode corresponds to second output power that is lower than the first output power.

The first power mode and the second power mode can be configured to correspond to power classes (PCs). Power classes (PCs) refer to classification divisions of output power for terminals, defined by, for example, maximum output power. The higher the power class number, the greater the corresponding output power. The maximum output power is defined based on the output power at the antenna end of the terminal. The maximum output power can be measured using a method defined by 3GPP or other standardization organizations. For example, in FIG. 1, the maximum output power can be measured by measuring the power emitted from the antenna 2. In place of measuring emitted power, the output power of the antenna 2 can be measured using a measuring device (for example, a spectrum analyzer) that is coupled to a terminal provided near the antenna 2.

For example, the first power mode is a high-power mode. The first power mode corresponds to, for example, a mode for Power Class 2 (PC2, maximum output power: 26 dBm). The second power mode is a middle-power mode or low-power mode (referred to as middle/low-power mode). The second power mode corresponds to, for example, a mode for Power Class 3 (PC3, maximum output power: 23 dBm).

The first power mode may correspond to a mode for Power Class 1 (PC1, maximum output power: 31 dBm) or Power Class 1.5 (PC1.5, maximum output power: 29 dBm). In this case, the middle/low-power mode may be a mode for PC2.

In the power amplifier circuit 100, the switches included in the switching circuit 140 are controllable to be turned on or off by the control circuit (not illustrated in the drawing) to suit the individual operating modes. In the present embodiment, the first switch 161 and the second switch 162 are configured to be controlled in the manner that prevents the first switch 161 and the second switch 162 from being concurrently turned on. The third switch 163 and the fourth switch 164 are configured to be controlled in the manner that prevents the third switch 163 and the fourth switch 164 from being concurrently turned on. The individual switches can be turned on or off in different manners that suit the operating modes. Since the switches can be turned on or off in different manners, the current (signal) flowing through the TLT circuit 130 accordingly varies. The following describes specific operations of the power amplifier circuit 100 in the individual operating modes.

[1.3.1 High-Power Mode]

Figure 3A:
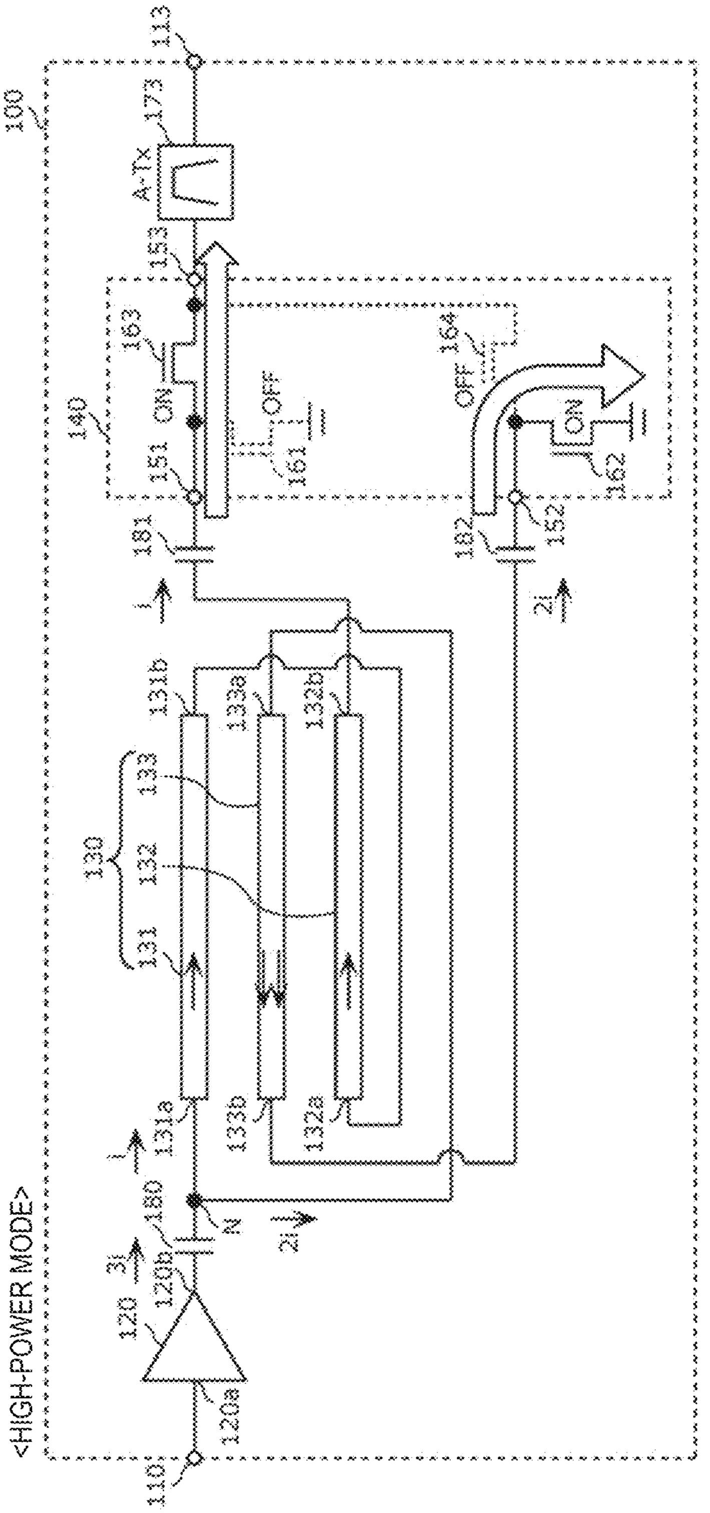
FIG. 3A illustrates current flows in the power amplifier circuit according to the first embodiment in operation in a high-power mode.

First, an operation of the high-power mode will be described with reference to FIG. 3A. FIG. 3A illustrates current flows in the power amplifier circuit 100 in operation in the high-power mode.

As illustrated in FIG. 3A, in the high-power mode, the first switch 161 is turned off; the second switch 162 is turned on; the third switch 163 is turned on; and the fourth switch 164 is turned off. As a result, the first terminal 151 and the third terminal 153 are in the electrically continuous state. By contrast, the second terminal 152 and the third terminal 153 are in the electrically discontinuous state (open state). Since the second switch 162 is turned on, the second terminal 152 is coupled to ground (grounded).

As a result, among the transfer lines included in the TLT circuit 130, the second line 132 and the first line 131 that are coupled to the first terminal 151 function as a main line. The third line 133 coupled to the second terminal 152 (ground) functions as a sub-line. The third line 133 is configured as a shunt line with an end (specifically, the other end 133*b*) coupled to ground.

The term "main line" refers to a line that carries transmit signals amplified by the amplifier element 120 among the transfer lines included in the TLT circuit 130. The term "sub-line" refers to a line other than the main line among the transfer lines included in the TLT circuit 130; the "sub-line" is electromagnetically coupleable to the main line. In the present embodiment, the sub-line is a shunt line with an end coupled to ground.

As illustrated in FIG. 3A, a current i is assumed to flow in both the first line 131 and the second line 132, which together function as a main line. Both the first line 131 and the second line 132 are electromagnetically coupled to the third line 133 that functions as a shunt line. As a result, the third line 133 carries a current (2i) that is twice as much as the current i flowing in each of the first line 131 and the second line 132. Thus, the current (a current $i_L$ described later) flowing from the output terminal 120*b* of the amplifier element 120 toward the node N is equal to the sum of the current i flowing in the main line and the current 2i flowing in the sub-line (shunt line), amounting to 3i.

[1.3.2 Middle/Low-Power Mode]

Figure 3B:
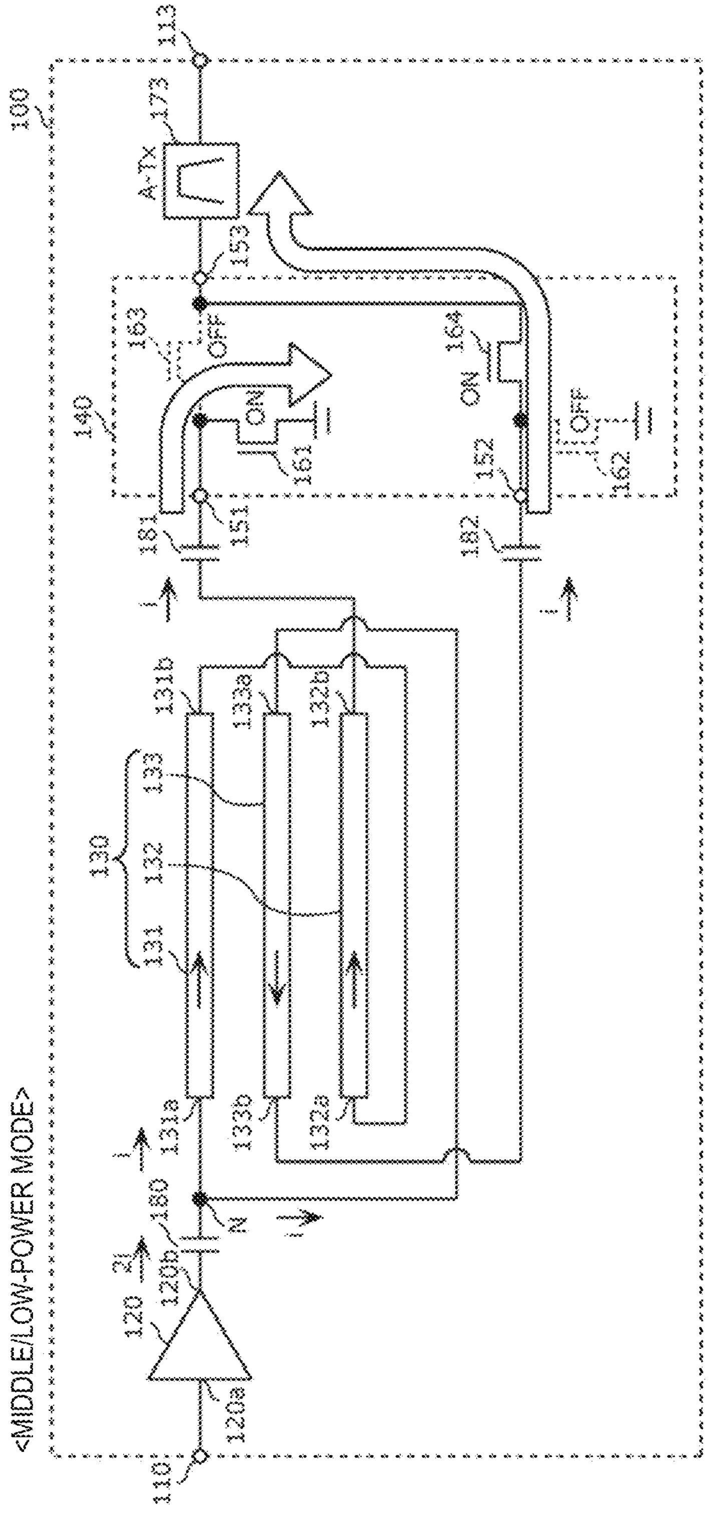
FIG. 3B illustrates current flows in the power amplifier circuit according to the first embodiment in operation in a middle/low-power mode.

Next, an operation of the middle/low-power mode will be described with reference to FIG. 3B. FIG. 3B illustrates current flows in the power amplifier circuit 100 in operation in the middle/low-power mode.

As illustrated in FIG. 3B, in the middle/low-power mode, the first switch 161 is turned on; the second switch 162 is turned off; the third switch 163 is turned off; and the fourth switch 164 is turned on. As a result, the first terminal 151 and the third terminal 153 are in the electrically discontinuous state (open state). By contrast, the second terminal 152 and the third terminal 153 are in the electrically continuous state. Since the first switch 161 is turned on, the first terminal 151 is coupled to ground (grounded).

As a result, among the transfer lines included in the TLT circuit 130, the third line 133 coupled to the second terminal 152 functions as a main line. The second line 132 and the first line 131 that are coupled to the first terminal 151 (ground) function as a sub-line (shunt line).

As illustrated in FIG. 3B, a current i is assumed to flow in the third line 133 that functions as a main line. The third line 133 is electromagnetically coupled to both the first line 131 and the second line 132 that function as a shunt line. As a result, the first line 131 and the second line 132 carry a current (i) of the same magnitude as the current flowing in the third line 133. Thus, the current (a current $i_L$ described later) flowing from the output terminal 120*b* of the amplifier element 120 toward the node N is equal to the sum of the current i flowing in the main line and the current i flowing in the sub-line (shunt line), amounting to 2i.

[1.3.3 Output Impedance Conversion Ratio]

As described above, the on-state and the off-state in the switching circuit 140 can be changed to suit the individual operating modes, and the main line and the sub-line of the TLT circuit 130 can be accordingly interchanged. As a result, the magnitude of current outputted from the amplifier element 120 varies according to the individual operating modes. This is because the output impedance conversion ratio of the TLT circuit 130 coupled to the output terminal 120*b* of the amplifier element 120 varies according to the individual operating modes.

The output impedance of the amplifier element 120 is $Z_C$, and the output impedance of the TLT circuit 130 is $Z_L$. The output impedance of the TLT circuit 130 is equal to the output impedance at the output end of the main line. Since the first line 131 and the second line 132 function as the main line in the high-power mode, $Z_L$ is the output impedance at the other end 132*b* of the second line 132.

The conversion ratio of the TLT circuit 130 is $Z_C/Z_L$. In the high-power mode, the conversion ratio $Z_C/Z_L$ is given by the following expression (1).

[Math. 1]

$$\frac{Z_C}{Z_L} = \left(\frac{i_C}{i_L}\right)^2 = \left(\frac{i}{3i}\right)^2 = \frac{1}{9} \tag{1}$$

$i_L$ represents the current outputted from the output terminal 120*b* of the amplifier element 120; in the high-power mode, as described above, $i_L$ is equal to 3i. $i_C$ represents the current outputted from the main line of the TLT circuit 130; as described above, $i_C$ is equal to i. Therefore, as given by Expression (1) presented above, the conversion ratio $Z_C/Z_L$ is 1/9.

Similarly to the high-power mode, the conversion ratio in the middle/low-power mode is given by the following expression (2). Since the third line 133 functions as the main line in the middle/low-power mode, $Z_L$ represents the output impedance at the other end 133*b* of the third line 133.

[Math. 2]

$$\frac{Z_C}{Z_L} = \left(\frac{i_C}{i_L}\right)^2 = \left(\frac{i}{2i}\right)^2 = \frac{1}{4} \tag{2}$$

In the middle/low-power mode, the current $i_L$ outputted from the output terminal 120*b* of the amplifier element 120 is less than in the high-power mode. As a result, the output impedance conversion ratio $Z_C/Z_L$ of the TLT circuit 130 increases by a factor of 2.25, from 1/9 to 1/4. As such, the efficiency of the power amplifier circuit 100 increases in the middle/low-power mode.

With Doherty amplifiers, the output impedance conversion ratio can also be changed. However, the conversion ratio can increase by a factor that is as low as 2. Since the power amplifier circuit 100 according to the present embodiment increases the output impedance conversion ratio by a factor of 2.25, the power amplifier circuit 100 achieves higher efficiency than Doherty amplifiers.

[1.4 Effects]

As described above, the power amplifier circuit 100 according to the present embodiment includes the amplifier element 120, the TLT circuit 130 including the first line 131, the second line 132, and the third line 133, and the switching circuit 140 including the first terminal 151, the second terminal 152, and the third terminal 153. The one end 131*a* of the first line 131 is coupled to the output terminal 120*b* of the amplifier element 120. The other end 131*b* of the first line 131 is coupled to the one end 132*a* of the second line 132. The other end 132*b* of the second line 132 is coupled to the first terminal 151. The one end 133*a* of the third line 133 is coupled between the one end 131*a* of the first line 131 and the output terminal 120*b* of the amplifier element 120. The other end 133*b* of the third line 133 is coupled to the second terminal 152. The third terminal 153 can be coupled to at least one of the first terminal 151 and the second terminal 152. The switching circuit 140 includes the first switch 161 provided between the first terminal 151 and ground and the second switch 162 provided between the second terminal 152 and ground.

This configuration enables switching between a first mode (for example, the high-power mode) and a second mode (for example, the middle/low-power mode) by controlling the first switch 161 and the second switch 162 to be turned on or off. In the first mode, the first line 131 and the second line 132 are used as a main line, and the third line 133 is used as a sub-line (shunt line). In the second mode, the third line 133 is used as a main line, and the first line 131 and the second line 132 are used as a sub-line (shunt line). The impedance conversion ratio $Z_C/Z_L$ of the TLT circuit 130 varies between the first mode and the second mode. With this configuration, one mode with low current consumption can be selected. As such, this configuration improves the efficiency of the power amplifier circuit 100.

The power amplifier circuit 100 according to the present embodiment enables alteration of the impedance conversion ratio $Z_C/Z_L$ using the switching circuit 140, while maintaining the feature of the TLT circuit 130 as a wide-band circuit. Thus, the power amplifier circuit 100 is implemented with the wide-band feature.

In an example, the third terminal 153 is configured to be selectively coupled to the first terminal 151 or the second terminal 152. The switching circuit 140 further includes the third switch 163 provided between the first terminal 151 and the third terminal 153 and the fourth switch 164 provided between the second terminal 152 and the third terminal 153.

This configuration enables the third terminal 153 to be used as a common terminal. In other words, the third terminal 153 can be used to output radio-frequency signals amplified in the highly efficient manners that suit the individual modes.

In an example, the power amplifier circuit 100 further includes the capacitor 181 coupled in series between the other end 132*b* of the second line 132 and the first terminal 151, and the capacitor 182 coupled in series between the other end 133*b* of the third line 133 and the second terminal 152.

With this configuration, the capacitor 181 is able to cancel at least a portion of the parasitic inductance component generated in the path connecting the other end 132*b* of the second line 132 and the first terminal 151; the capacitor 182 is able to cancel at least a portion of the parasitic inductance component generated in the path connecting the other end 133*b* of the third line 133 and the second terminal 152.

In an example, the switching circuit 140 is configured to turn off the first switch 161 and turn on the second switch 162 in the first power mode (high-power mode) that corresponds to the first output power. The switching circuit 140 is configured to turn off the second switch 162 and turn on the first switch 161 in the second power mode that corresponds to the second output power (middle/low-power mode) lower than the first output power.

With this configuration, the impedance conversion ratio $Z_C/Z_L$ of the TLT circuit 130 is increased in the second power mode, and current consumption is accordingly reduced. As such, this configuration improves the efficiency of the power amplifier circuit 100.

In an example, switching between the first mode and the second mode is executed, and the first mode or the second mode is performed. The first mode is configured such that, using the TLT circuit 130 that includes the first line 131 with the one end 131*a* coupled to the output terminal 120*b* of the amplifier element 120, the second line 132 with the one end 132*a* coupled to the other end 131*b* of the first line 131, and the third line 133 with the one end 133*a* coupled between the one end 131*a* of the first line 131 and the output terminal 120*b* of the amplifier element 120, the other end 133*b* of the third line 133 is coupled to ground, the amplifier element 120 amplifies a radio-frequency signal, and the amplified radio-frequency signal is output from the other end 132*b* of the second line 132. The second mode is configured such that, while the other end 132*b* of the second line 132 is coupled to ground, the amplifier element 120 amplifies a radio-frequency signal, and the amplified radio-frequency signal is output from the other end 133*b* of the third line 133.

With this configuration, the impedance conversion ratio $Z_C/Z_L$ of the TLT circuit 130 varies between the first mode and the second mode. As a result, one mode with low current consumption can be selected. As such, this configuration improves the efficiency of power amplification.

Second Embodiment

Next, a second embodiment will be described.

A power amplifier circuit according to the second embodiment differs from the first embodiment in the configuration of the switching circuit and the number of radio-frequency signal bands that the amplifier element is capable of amplifying. The following primarily describes features that differ from the first embodiment, and descriptions of common features will not be repeated or will be simplified.

2.1 Circuit Configuration of Power Amplifier Circuit 101

Figure 4:
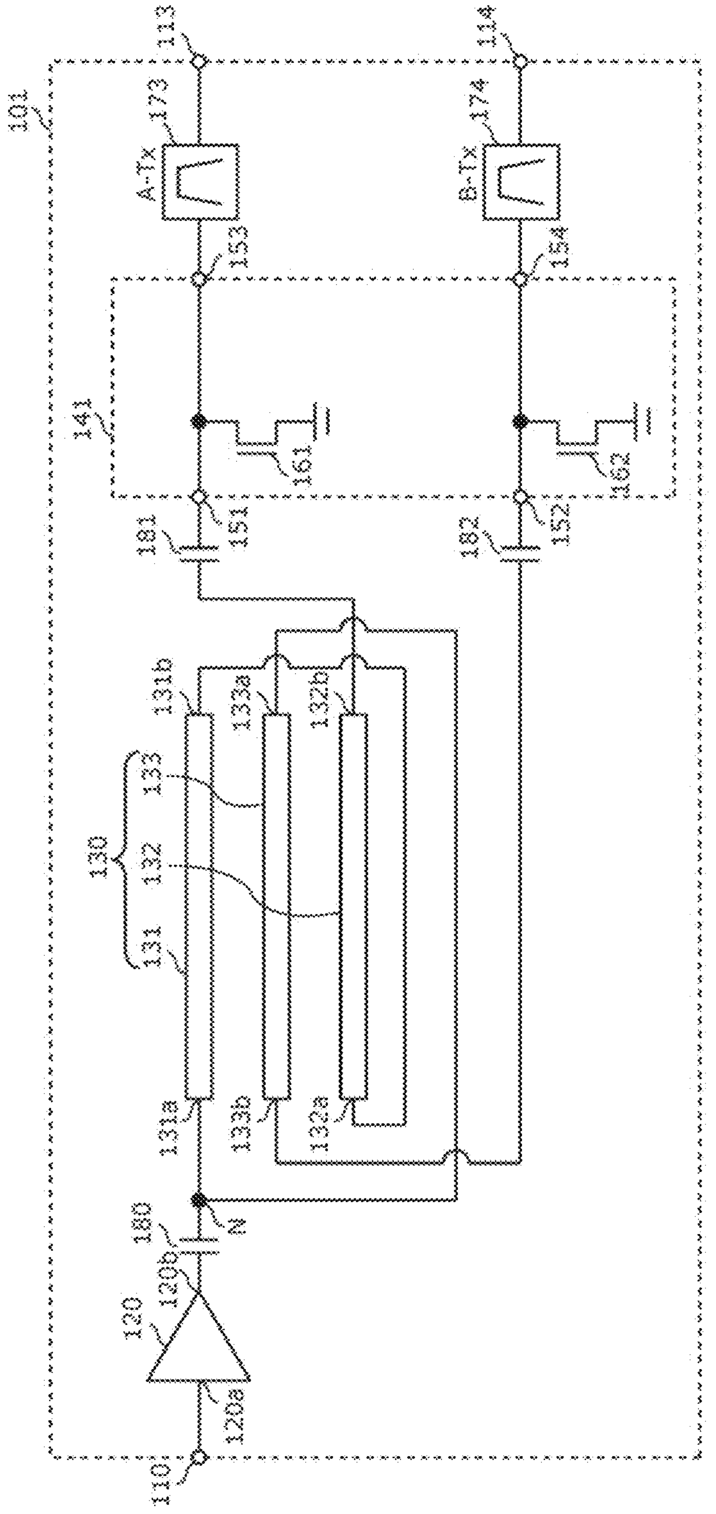
FIG. 4 is a circuit configuration diagram of a power amplifier circuit according to a second embodiment.

First, a power amplifier circuit 101 according to the second embodiment will be described with reference to FIG. 4. FIG. 4 is a circuit configuration diagram of the power amplifier circuit 101 according to the present embodiment.

The power amplifier circuit 101 illustrated in FIG. 4 is operable to amplify and output transmit signals in multiple bands. Specifically, an amplifier element 120 of the power amplifier circuit 101 is able to amplify transmit signals in two communication bands of bands A and B.

The band B is a communication band that differs from the band A. The band A represents, for example, 4G-LTE Band B41 (transmit/receive frequency range: 2496-2690 MHZ). The band B represents, for example, 4G-LTE Band B7 (transmit frequency range: 2500-2570 MHZ).

As illustrated in FIG. 4, the power amplifier circuit 101 includes a switching circuit 141 in place of the switching circuit 140 in the power amplifier circuit 100 according to the first embodiment. The power amplifier circuit 101 also includes a filter 174 and an external output terminal 114.

The switching circuit 141 differs from the switching circuit 140 according to the first embodiment in that the switching circuit 141 does not include the third switch 163 and the fourth switch 164 but instead includes a fourth terminal 154. Specifically, the second terminal 152 is coupled not to the third terminal 153 but to the fourth terminal 154. The fourth terminal 154 is an output terminal for outputting transmit signals. No switch (series switch) is provided between the second terminal 152 and the fourth terminal 154. In other words, the second terminal 152 and the fourth terminal 154 are directly coupled to each other.

Similarly, no switch (series switch) is provided between the first terminal 151 and the third terminal 153. In other words, the first terminal 151 and the third terminal 153 are directly coupled to each other.

As described above, the switching circuit 141 has no common terminal. The path connecting the first terminal 151 and the third terminal 153 is configured to achieve the electrically continuous state at any time. The path connecting the second terminal 152 and the fourth terminal 154 is configured to achieve the electrically continuous state at any time. These two paths are not coupled to each other.

The filter 174 (B-Tx) has a pass band that includes the band B. Specifically, the filter 174 is a transmit filter with a pass band that includes an uplink operating band of the band B. The filter 174 is thus operable to pass transmit signals in the band B out of the transmit signals amplified by the amplifier element 120.

The filter 174 is coupled between the fourth terminal 154 of the switching circuit 141 and the external output terminal 114. Similarly to the filter 173, the filter 174 may be implemented using any of a SAW filter, a BAW filter, an LC resonance filter, and a dielectric filter. However, these examples are not to be interpreted as limiting. The filter 174 is not necessarily included in the power amplifier circuit 101.

Band B41 is a TDD communication band. Thus, the filter 173 is a TDD filter and capable of passing receive signals. The receive signals in Band B41 after passing through the filter 173 may be input to the third terminal 153 of the switching circuit 141. In this case, the switching circuit 141 may include a receive path that carries receive signals. A switch may be provided in series in the receive path to ensure isolation between transmission and reception. The switching circuit 141 may include an output terminal for the receive path.

The power amplifier circuit 101 illustrated in FIG. 4 is provided in place of the power amplifier circuit 100 in the radio-frequency circuit 1 of the communication device 5 illustrated in FIG. 1. The external output terminals 113 and 114 of the power amplifier circuit 101 are coupled to the antenna connection terminal 11 of the radio-frequency circuit 1. The radio-frequency circuit 1 may include switches and/or duplexers between the external output terminals 113 and 114 and the antenna connection terminal 11.

2.2 Operation

Next, the operation of the power amplifier circuit 101 will be described with respect to different operating modes.

2.2.1 High-Power Mode

Figure 5A:
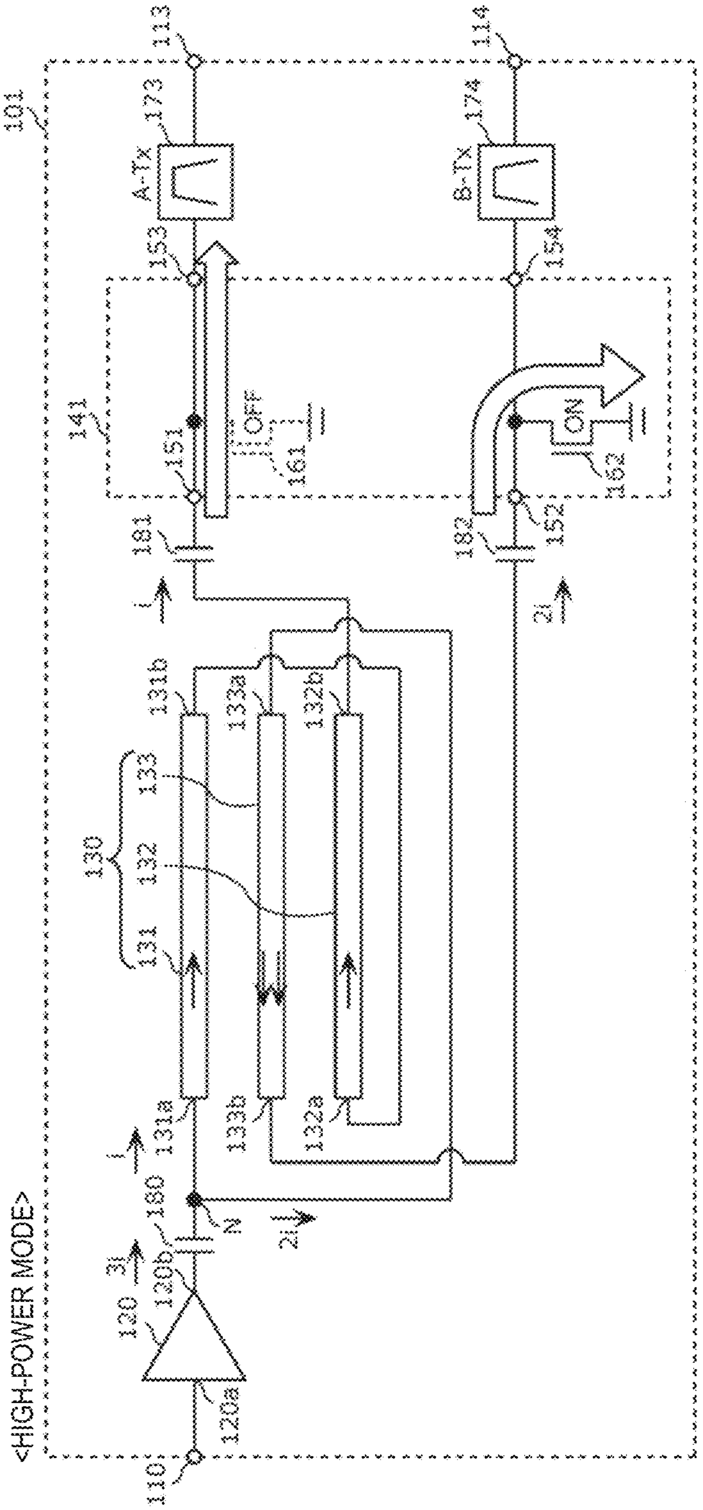
FIG. 5A illustrates current flows in the power amplifier circuit according to the second embodiment in operation in a high-power mode.

First, an operation of the high-power mode will be described with reference to FIG. 5A. FIG. 5A illustrates current flows in the power amplifier circuit 101 in operation in the high-power mode.

As illustrated in FIG. 5A, in the high-power mode, the first switch 161 is turned off; and the second switch 162 is turned on. Since the second switch 162 is turned on, the second terminal 152 is coupled to ground (grounded).

As a result, among the transfer lines included in the TLT circuit 130, the second line 132 and the first line 131 that are coupled to the first terminal 151 function as a main line. The third line 133 coupled to the second terminal 152 (ground) functions as a sub-line (shunt line). As a result, the current flowing through the TLT circuit 130 is the same as in the first embodiment. Thus, also in the power amplifier circuit 101 according to the present embodiment, the output impedance conversion ratio $Z_C/Z_L$ of the TLT circuit 130 in the high-power mode is 1/9.

2.2.2 Middle/Low-Power Mode

Figure 5B:
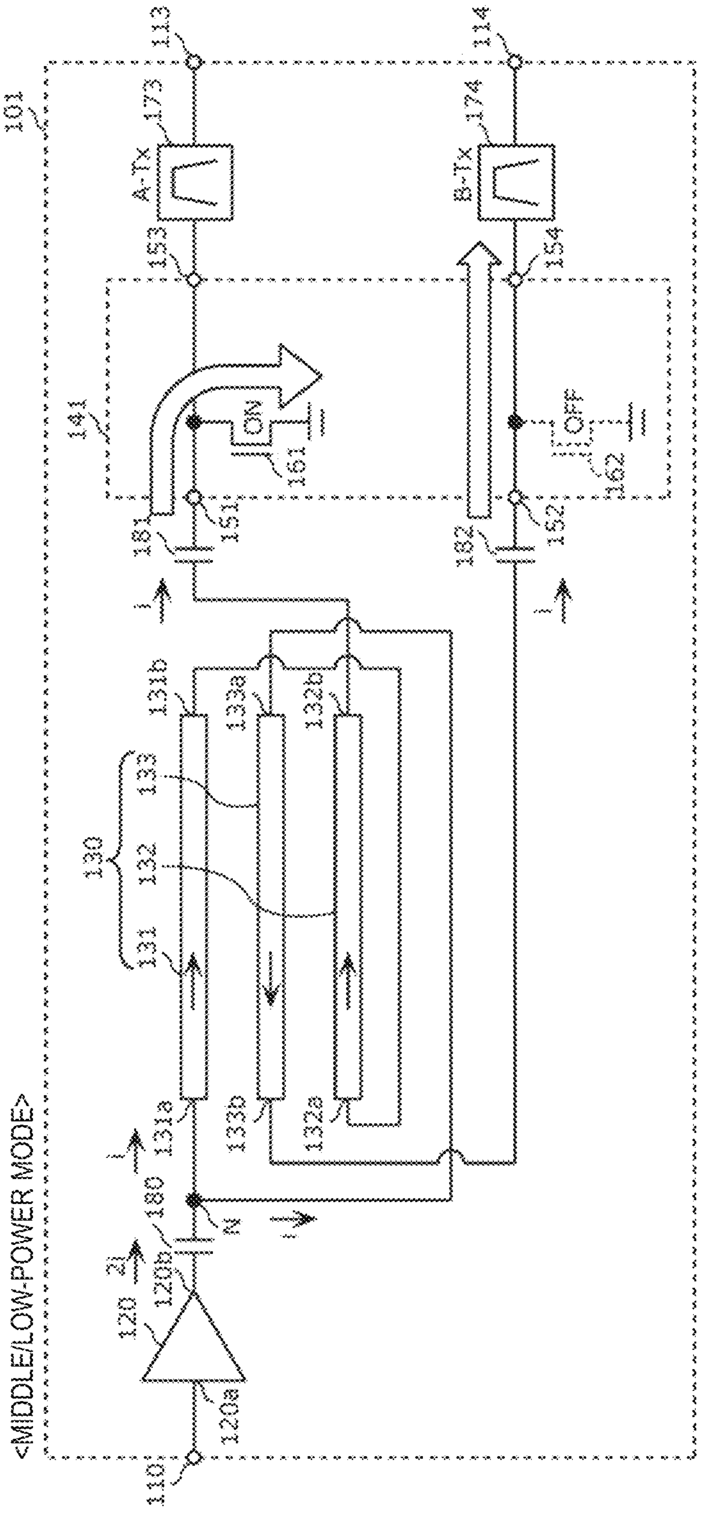
FIG. 5B illustrates current flows in the power amplifier circuit according to the second embodiment in operation in a middle/low-power mode.

Next, an operation of the middle/low-power mode will be described with reference to FIG. 5B. FIG. 5B illustrates current flows in the power amplifier circuit 101 in operation in the middle/low-power mode.

As illustrated in FIG. 5B, in the middle/low-power mode, the first switch 161 is turned on; and the second switch 162 is turned off. Since the first switch 161 is turned on, the first terminal 151 is coupled to ground (grounded).

As a result, among the transfer lines included in the TLT circuit 130, the third line 133 coupled to the second terminal 152 functions as a main line. The second line 132 and the first line 131 that are coupled to the first terminal 151 (ground) function as a sub-line (shunt line). As a result, the current flowing through the TLT circuit 130 is the same as in the first embodiment. Thus, also in the power amplifier circuit 101 according to the present embodiment, the output impedance conversion ratio $Z_C/Z_L$ of the TLT circuit 130 in the middle/low-power mode is 1/4.

Upon switching from the high-power mode to the middle/low-power mode, the output impedance conversion ratio $Z_C/Z_L$ of the TLT circuit 130 increases by a factor of 2.25, from 1/9 to 1/4. As such, the efficiency of the power amplifier circuit 101 increases in the middle/low-power mode.

2.3 Effects

As described above, in the power amplifier circuit 101 according to the present embodiment, the switching circuit 141 further includes the fourth terminal 154. The third terminal 153 is coupled to the first terminal 151. The fourth terminal 154 is coupled to the second terminal 152.

With this configuration, the third terminal 153 and the fourth terminal 154 can be respectively coupled to two different filters. This configuration thus enables amplification of radio-frequency signals in two communication bands with high efficiency.

In an example, the third terminal 153 is directly coupled to the first terminal 151. The fourth terminal 154 is directly coupled to the second terminal 152.

With this configuration, no switches are provided in series in the path connecting the first terminal 151 and the third terminal 153 and in the path connecting the second terminal 152 and the fourth terminal 154. In other words, no series switches are provided in both paths. This configuration reduces resistance components (on-resistance) that can be caused by series switches. As a result, current consumption is reduced, and the efficiency of the power amplifier circuit 101 is improved.

Here, simulation results regarding the output impedance of the TLT circuit 130 in the power amplifier circuit 101 according to the present embodiment will be described with reference to FIG. 6.

Figure 6:
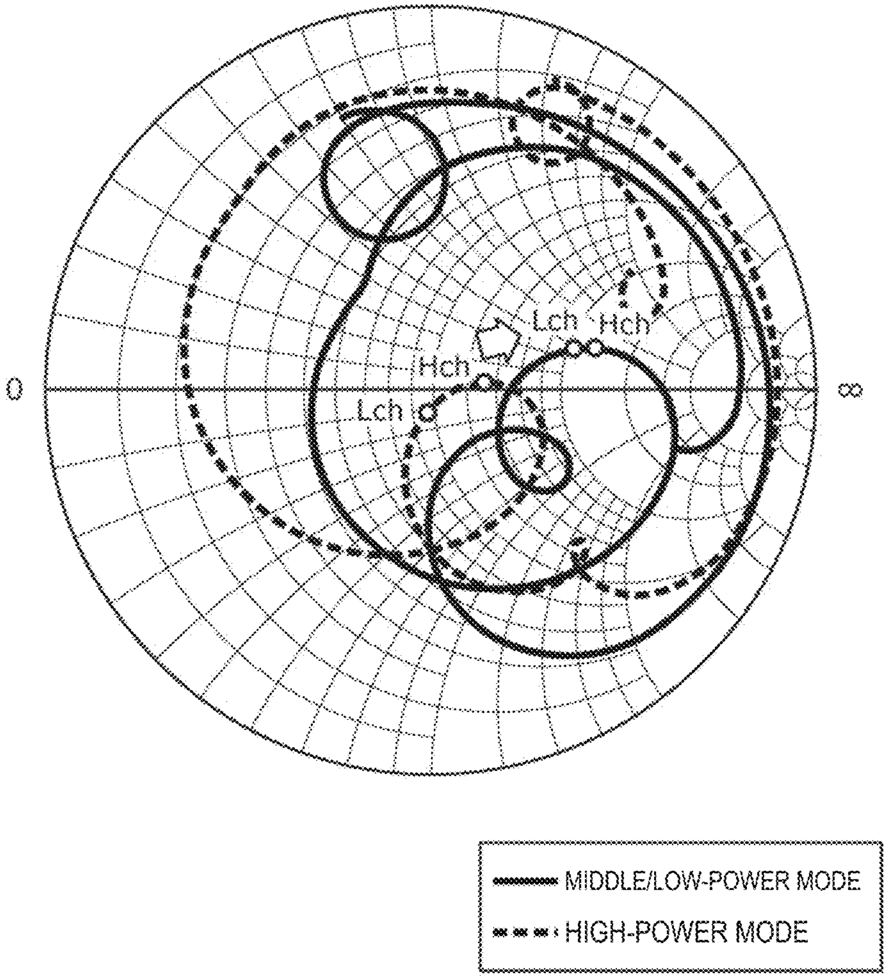
FIG. 6 is a Smith chart illustrating the output impedances of a transmission line transformer (TLT) circuit in the high-power mode and the middle/low-power mode.

FIG. 6 is a Smith chart illustrating the output impedances of the TLT circuit 130 in the high-power mode and the middle/low-power mode. FIG. 6 illustrates the results of simulating variations in output impedance in response to radio-frequency signals in the range of 1 MHz to 8 GHZ.

A thick dashed line represents the high-power mode. Lch on the thick dashed line represents the output impedance that corresponds to the lower frequency limit (2496 MHZ) of Band B41. Hch on the thick dashed line represents the output impedance that corresponds to the higher frequency limit (2690 MHZ) of Band B41.

A thick solid line represents the middle/low-power mode. Lch on the thick solid line represents the output impedance that corresponds to the lower frequency limit (2500 MHZ) of Band B7. Hch on the thick solid line represents the output impedance that corresponds to the higher frequency limit (2570 MHZ) of Band B7.

As illustrated in FIG. 6, assuming switching from the high-power mode to the middle/low-power mode, the output impedance shifts to the right (toward ∞) on the Smith chart (see a white arrow). Thus, the output impedance increases upon switching from the high-power mode to the middle/low-power mode. As such, the efficiency of the power amplifier circuit 101 increases in the middle/low-power mode.

Third Embodiment

Next, a third embodiment will be described.

A power amplifier circuit according to the third embodiment differs from the first or second embodiment in the configuration of the switching circuit and the number of radio-frequency signal bands that the amplifier element is capable of amplifying. The following primarily describes features that differ from the first or second embodiment, and descriptions of common features will not be repeated or will be simplified.

3.1 Circuit Configuration of Power Amplifier Circuit 102

Figure 7:
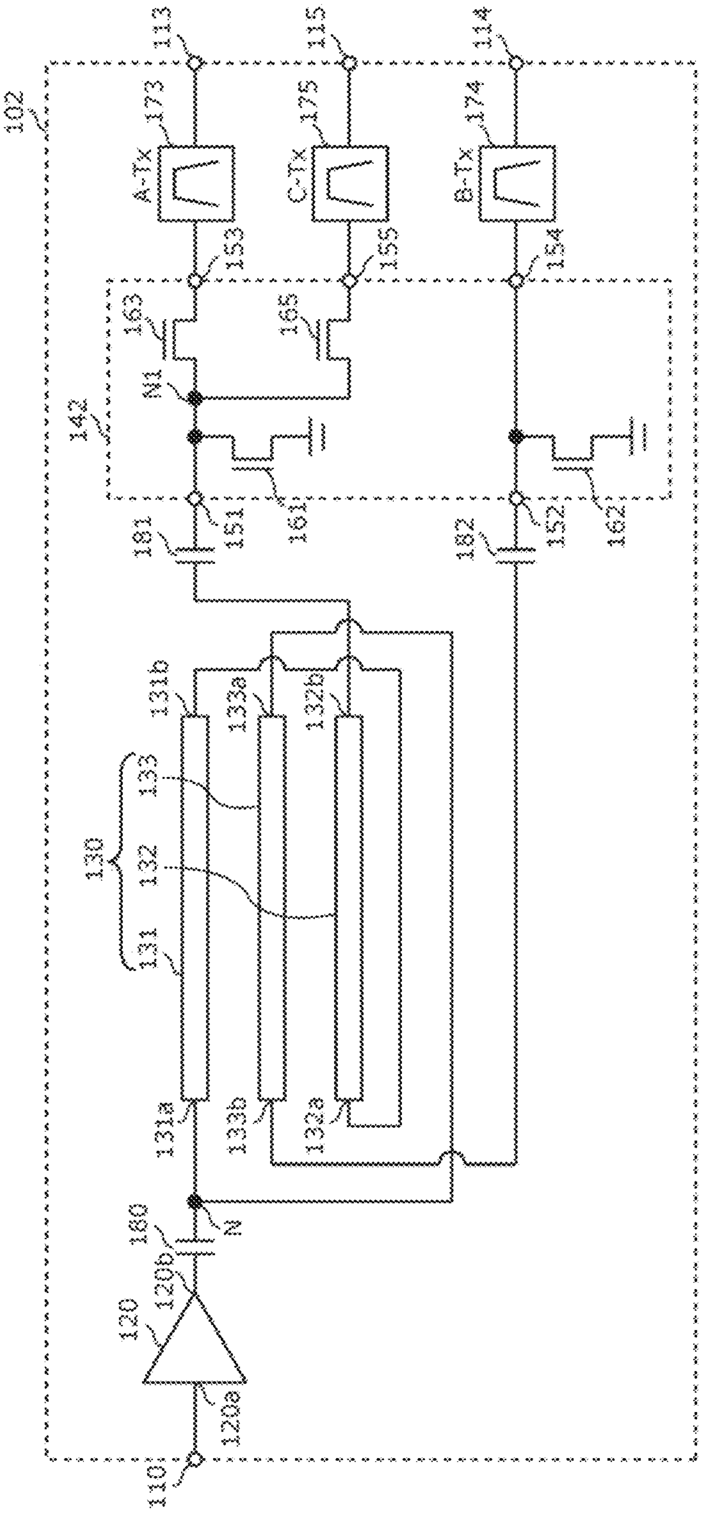
FIG. 7 is a circuit configuration diagram of a power amplifier circuit according to a third embodiment.

First, a power amplifier circuit 102 according to the third embodiment will be described with reference to FIG. 7. FIG. 7 is a circuit configuration diagram of the power amplifier circuit 102 according to the present embodiment.

The power amplifier circuit 102 illustrated in FIG. 7 is operable to amplify and output transmit signals in multiple bands. Specifically, an amplifier element 120 of the power amplifier circuit 102 is operable to amplify transmit signals in three communication bands of the bands A and B and a band C.

The band C is a communication band that differs from both the bands A and B. The band C represents, for example, 4G-LTE Band B40 (transmit/receive frequency range: 2300-2400 MHz).

As illustrated in FIG. 7, the power amplifier circuit 102 includes a switching circuit 142 in place of the switching circuit 141 in the power amplifier circuit 101 according to the second embodiment. The power amplifier circuit 102 also includes a filter 175 and an external output terminal 115.

The switching circuit 142 differs from the switching circuit 141 according to the second embodiment in that the switching circuit 142 includes a fifth terminal 155, a third switch 163, and a fifth switch 165. The fifth terminal 155 is an output terminal for outputting transmit signals. The fifth terminal 155 is coupleable to the first terminal 151. The first terminal 151 is a common terminal capable of establishing electrical continuity with each of a third terminal 153 and the fifth terminal 155.

The third switch 163 is provided between the first terminal 151 and the third terminal 153, as in the first embodiment. Specifically, the third switch 163 is provided between a node N1 and the third terminal 153. The node N1 is a branch point of the path connecting the first terminal 151 and the third terminal 153 and the path connecting the first terminal 151 and the fifth terminal 155.

The fifth switch 165 is provided between the first terminal 151 and the fifth terminal 155. Specifically, the fifth switch 165 is provided between the node N1 and the fifth terminal 155.

One end of the first switch 161 is coupled between the first terminal 151 and the node N1. The one end of the first switch 161 may be coupled directly to the first terminal 151 or directly to the node N1.

The filter 175 (C-Tx) has a pass band that includes the band C. Specifically, the filter 175 is a transmit filter with a pass band that includes an uplink operating band of the band C. The filter 175 is thus operable to pass transmit signals in the band C out of the transmit signals amplified by the amplifier element 120.

The filter 175 is coupled between the fifth terminal 155 of the switching circuit 142 and the external output terminal 115. Similarly to the filters 173 and 174, the filter 175 may be implemented using any of a SAW filter, a BAW filter, an LC resonance filter, and a dielectric filter. However, these examples are not to be interpreted as limiting. The filter 175 is not necessarily included in the power amplifier circuit 102.

The power amplifier circuit 102 illustrated in FIG. 7 is provided in place of the power amplifier circuit 100 in the radio-frequency circuit 1 of the communication device 5 illustrated in FIG. 1. The external output terminals 113, 114, and 115 of the power amplifier circuit 102 are coupled to the antenna connection terminal 11 of the radio-frequency circuit 1. The radio-frequency circuit 1 may include switches and/or duplexers between the external output terminals 113, 114, and 115 and the antenna connection terminal 11.

The fifth terminal 155 may be configured to be coupled to the second terminal 152. In this case, the fifth switch 165 can be provided between the second terminal 152 and the fifth terminal 155. A series switch may be provided between the second terminal 152 and the fourth terminal 154.

3.2 Operation

Next, the operation of the power amplifier circuit 102 will be described with respect to different operating modes.

3.2.1 High-Power Mode

Figure 8A:
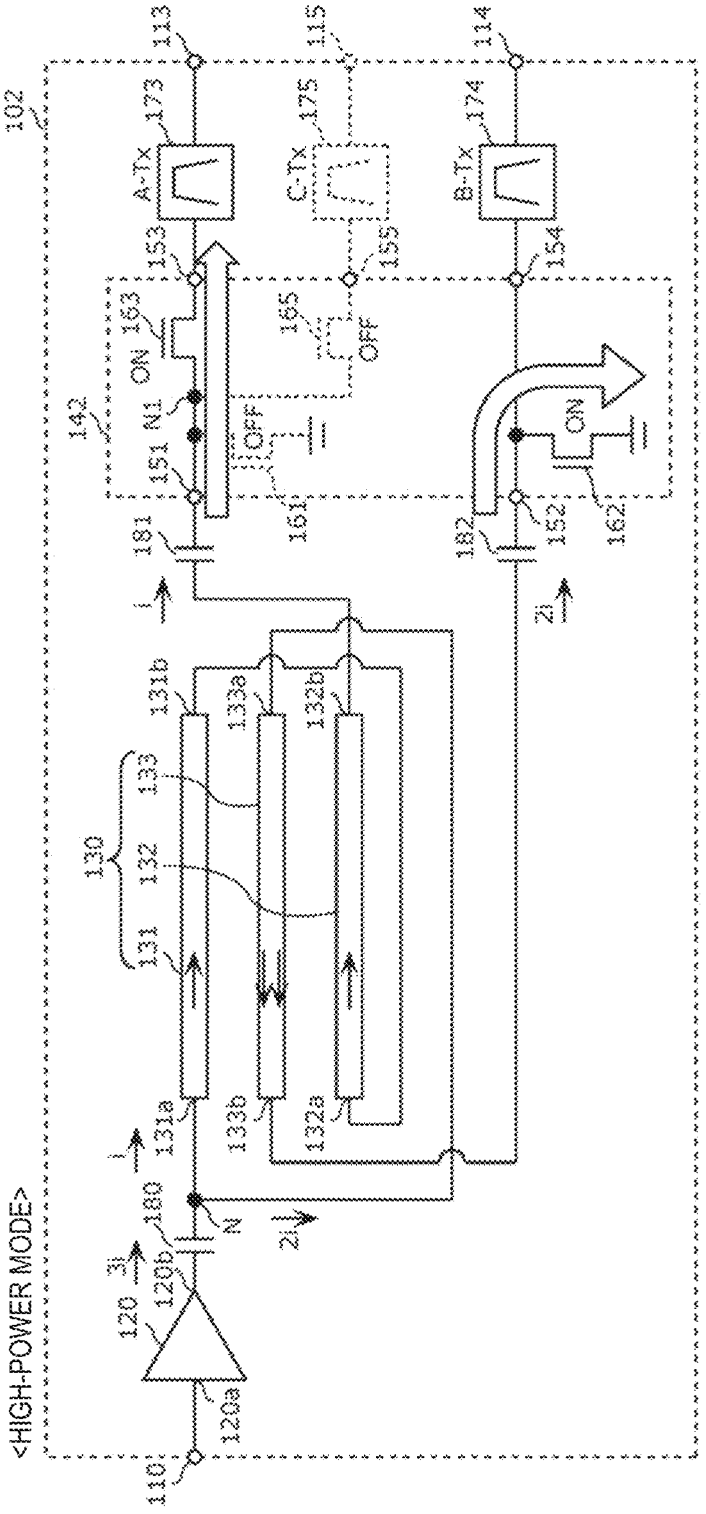
FIG. 8A illustrates current flows in the power amplifier circuit according to the third embodiment in operation in a high-power mode.

First, an operation of the high-power mode will be described with reference to FIG. 8A. FIG. 8A illustrates current flows in the power amplifier circuit 102 in operation in the high-power mode.

As illustrated in FIG. 8A, in the high-power mode, the first switch 161 is turned off, and the second switch 162 is turned on. Since the second switch 162 is turned on, the second terminal 152 is coupled to ground (grounded).

FIG. 8A illustrates an example of amplifying radio-frequency signals in the band A in the high-power mode. In this case, the third switch 163 is turned on, and the fifth switch 165 is turned off. As a result, the first terminal 151 and the third terminal 153 are in the electrically continuous state. The transmit signal in the band A, amplified by the amplifier element 120 and transferred through the TLT circuit 130, can be output from the third terminal 153 of the switching circuit 142 toward the filter 173. To amplify radio-frequency signals in the band C, the third switch 163 is turned off, and the fifth switch 165 is turned on. Assuming the first switch 161 is turned off in the high-power mode, either the third switch 163 or the fifth switch 165 can be turned on.

As a result, among the transfer lines included in the TLT circuit 130, the second line 132 and the first line 131 that are coupled to the first terminal 151 function as a main line. The third line 133 coupled to the second terminal 152 (ground) functions as a sub-line (shunt line). Thus, the current flowing through the TLT circuit 130 is the same as in the first embodiment. As such, also in the power amplifier circuit 102 according to the present embodiment, the output impedance conversion ratio $Z_C/Z_L$ of the TLT circuit 130 in the high-power mode is 1/9.

3.2.2 Middle/Low-Power Mode

Figure 8B:
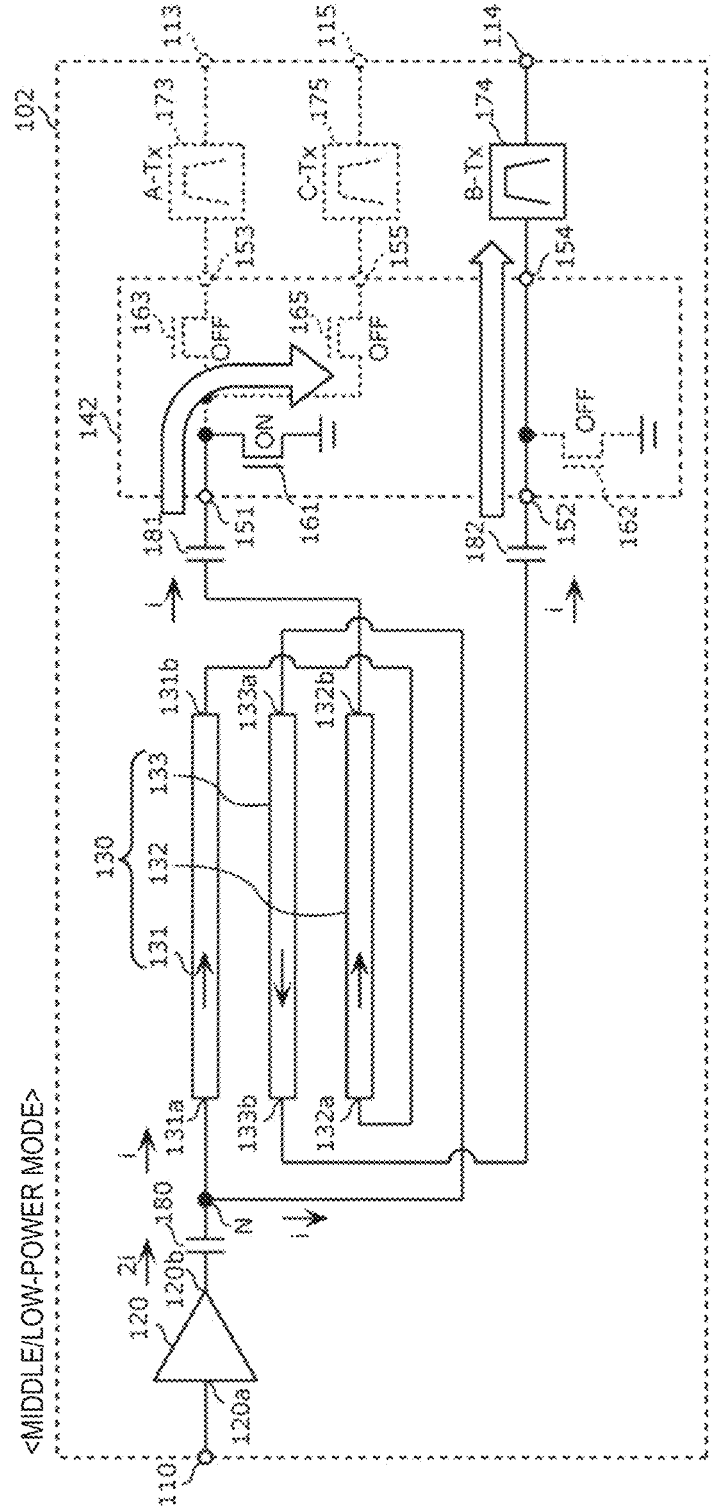
FIG. 8B illustrates current flows in the power amplifier circuit according to the third embodiment in operation in a middle/low-power mode.

Next, an operation of the middle/low-power mode will be described with reference to FIG. 8B. FIG. 8B illustrates current flows in the power amplifier circuit 102 in operation in the middle/low-power mode.

As illustrated in FIG. 8B, in the middle/low-power mode, the first switch 161 is turned on, and the second switch 162 is turned off. Since the first switch 161 is turned on, the first terminal 151 is coupled to ground (grounded). The third switch 163 and the fifth switch 165 are turned off. As a result, the first terminal 151 and each of the third terminal 153 and the fifth terminal 155 are in the electrically discontinuous state (open state).

Thus, among the transfer lines included in the TLT circuit 130, the third line 133 coupled to the second terminal 152 functions as a main line. The second line 132 and the first line 131 that are coupled to the first terminal 151 (ground) function as a sub-line (shunt line). As a result, the current flowing through the TLT circuit 130 is the same as in the first embodiment. As such, also in the power amplifier circuit 102 according to the present embodiment, the output impedance conversion ratio $Z_C/Z_L$ of the TLT circuit 130 in the middle/low-power mode is 1/4.

Upon switching from the high-power mode to the middle/low-power mode, the output impedance conversion ratio $Z_C/Z_L$ of the TLT circuit 130 increases by a factor of 2.25, from 1/9 to 1/4. As such, the efficiency of the power amplifier circuit 102 increases in the middle/low-power mode.

3.3 Effects

As described above, in the power amplifier circuit 102 according to the present embodiment, the switching circuit 142 further includes the fifth terminal 155 coupled to the first terminal 151, the third switch 163 provided between the first terminal 151 and the third terminal 153, and the fifth switch 165 provided between the first terminal 151 and the fifth terminal 155.

With this configuration, the third terminal 153, the fourth terminal 154, and the fifth terminal 155 can be respectively coupled to three different filters. This configuration thus enables amplification of radio-frequency signals in three communication bands with high efficiency.

In an example, the fourth terminal 154 is directly coupled to the second terminal 152.

As a result, no switch is provided in series in the path connecting the second terminal 152 and the fourth terminal 154. In other words, no series switch is provided in the path. This configuration hinders resistance components (on-resistance) that can be caused by series switches. As such, current consumption is reduced, and the efficiency of the power amplifier circuit 102 is improved.

Fourth Embodiment

Next, a fourth embodiment will be described.

A power amplifier circuit according to the fourth embodiment differs from the first to third embodiments in the configuration of the switching circuit and the number of radio-frequency signal bands that the amplifier element is capable of amplifying. The following primarily describes features that differ from the first to third embodiments, and descriptions of common features will not be repeated or will be simplified.

4.1 Circuit Configuration of Power Amplifier Circuit 103

Figure 9:
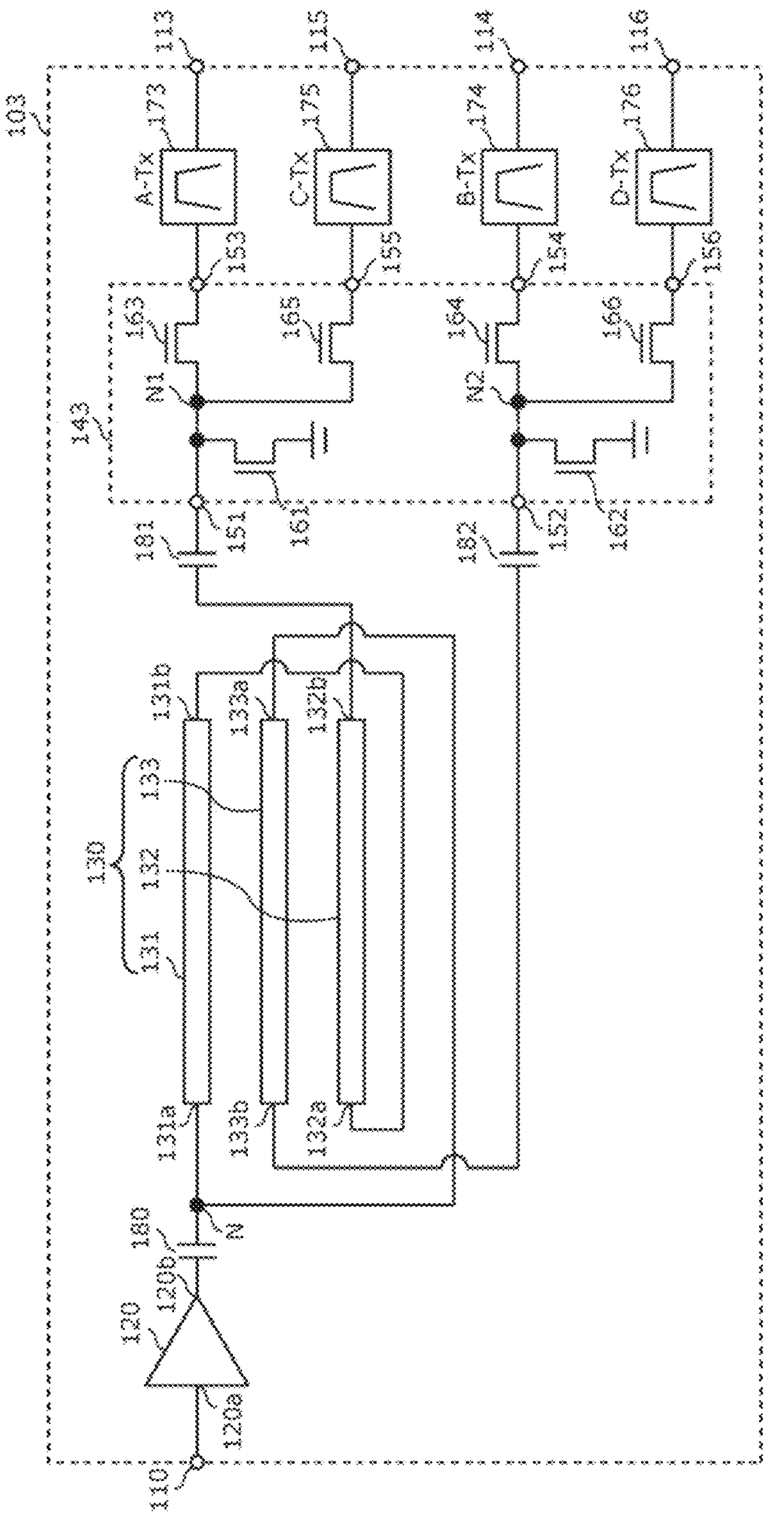
FIG. 9 is a circuit configuration diagram of a power amplifier circuit according to a fourth embodiment.

First, a power amplifier circuit 103 according to the fourth embodiment will be described with reference to FIG. 9. FIG. 9 is a circuit configuration diagram of the power amplifier circuit 103 according to the present embodiment.

The power amplifier circuit 103 illustrated in FIG. 9 is operable to amplify and output transmit signals in multiple bands. Specifically, an amplifier element 120 of the power amplifier circuit 103 is operable to amplify transmit signals in four communication bands of the bands A, B, and C and a band D.

The band D is a communication band that differs from the bands A, B, and C. The band D represents, for example, 4G-LTE Band B30 (transmit frequency range: 2305-2315 MHz).

As illustrated in FIG. 9, the power amplifier circuit 103 includes a switching circuit 143 in place of the switching circuit 142 in the power amplifier circuit 102 according to the third embodiment. The power amplifier circuit 103 also includes a filter 176 and an external output terminal 116.

The switching circuit 143 differs from the switching circuit 142 according to the third embodiment in that the switching circuit 143 includes a sixth terminal 156, a fourth switch 164, and a sixth switch 166. The sixth terminal 156 is an output terminal for outputting transmit signals. The sixth terminal 156 is coupleable to the second terminal 152. The second terminal 152 is a common terminal capable of establishing electrical continuity with each of a fourth terminal 154 and the sixth terminals and 156.

The fourth switch 164 is provided between the second terminal 152 and the fourth terminal 154. Specifically, the fourth switch 164 is provided between a node N2 and the fourth terminal 154. The node N2 is a branch point of the path connecting the second terminal 152 and the fourth terminal 154 and the path connecting the second terminal 152 and the sixth terminal 156.

The sixth switch 166 is provided between the second terminal 152 and the sixth terminal 156. Specifically, the sixth switch 166 is provided between the node N2 and the sixth terminal 156.

One end of the second switch 162 is coupled between the second terminal 152 and the node N2. The one end of the second switch 162 may be coupled directly to the second terminal 152 or directly to the node N2.

The filter 176 (D-Tx) has a pass band that includes the band D. Specifically, the filter 176 is a transmit filter with a pass band that includes an uplink operating band of the band D. The filter 176 is thus operable to pass transmit signals in the band D out of the transmit signals amplified by the amplifier element 120.

The filter 176 is coupled between the sixth terminal 156 of the switching circuit 143 and the external output terminal 116. Similarly to the filters 173, 174, and 175, the filter 176 may be implemented using any of a SAW filter, a BAW filter, an LC resonance filter, and a dielectric filter. However, these examples are not to be interpreted as limiting. The filter 176 is not necessarily included in the power amplifier circuit 103.

The power amplifier circuit 103 illustrated in FIG. 9 is provided in place of the power amplifier circuit 100 in the radio-frequency circuit 1 of the communication device 5 illustrated in FIG. 1. The external output terminals 113, 114, 115, and 116 of the power amplifier circuit 103 are coupled to the antenna connection terminal 11 of the radio-frequency circuit 1. The radio-frequency circuit 1 may include switches and/or duplexers between the external output terminals 113, 114, 115, and 116 and the antenna connection terminal 11.

The switching circuit 143 may further include a terminal coupled to the first terminal 151. In this case, a switch can be provided between the terminal and the node N1. The switching circuit 143 may further include a terminal coupled to the second terminal 152. In this case, a switch can be provided between the terminal and the node N2.

4.2 Operation

Next, the operation of the power amplifier circuit 103 will be described with respect to different operating modes.

4.2.1 High-Power Mode

Figure 10A:
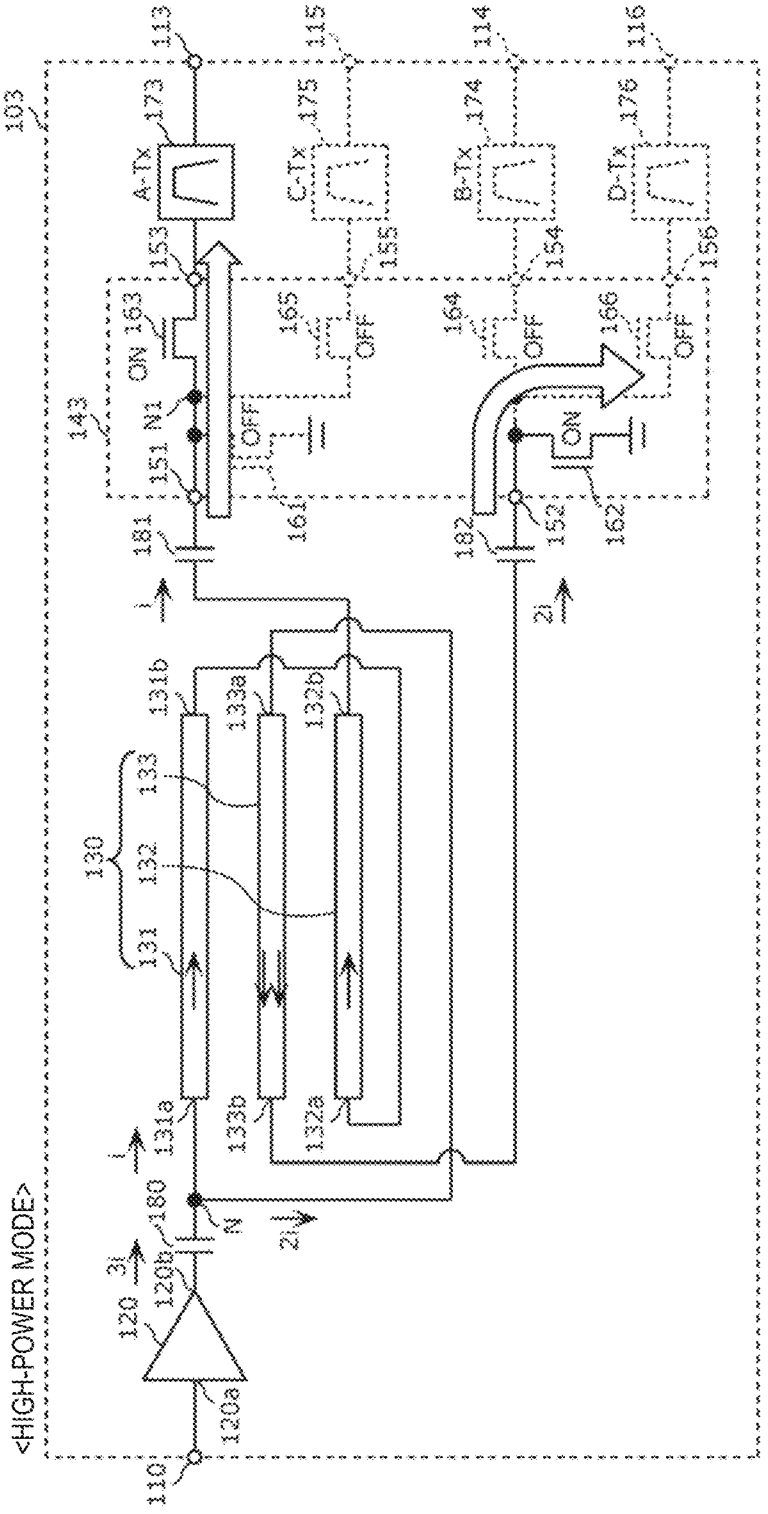
FIG. 10A illustrates current flows in the power amplifier circuit according to the fourth embodiment in operation in a high-power mode.

First, an operation of the high-power mode will be described with reference to FIG. 10A. FIG. 10A illustrates current flows in the power amplifier circuit 103 in operation in the high-power mode.

As illustrated in FIG. 10A, in the high-power mode, the first switch 161 is turned off, and the second switch 162 is turned on. Since the second switch 162 is turned on, the second terminal 152 is coupled to ground (grounded).

FIG. 10A illustrates an example of amplifying radio-frequency signals in the band A in the high-power mode. In this case, the third switch 163 is turned on, and the fourth switch 164, the fifth switch 165, and the sixth switch 166 are all turned off. As a result, the first terminal 151 and the third terminal 153 are in the electrically continuous state. The transmit signal in the band A, amplified by the amplifier element 120 and transferred through the TLT circuit 130, can be output from the third terminal 153 of the switching circuit 143 toward the filter 173. At this time, the first terminal 151 and the fifth terminal 155 are in the electrically discontinuous state (open state). The second terminal 152 and each of the fourth terminal 154 and the sixth terminal 156 are in the electrically discontinuous state (open state).

To amplify radio-frequency signals in the band C, the third switch 163, the fourth switch 164, and the sixth switch 166 are turned off, and the fifth switch 165 is turned on. Assuming the first switch 161 is turned off in the high-power mode, either the third switch 163 or the fifth switch 165 is turned on.

As a result, among the transfer lines included in the TLT circuit 130, the second line 132 and the first line 131 that are coupled to the first terminal 151 function as a main line. The third line 133 coupled to the second terminal 152 (ground) functions as a sub-line (shunt line). Thus, the current flowing through the TLT circuit 130 is the same as in the first embodiment. As such, also in the power amplifier circuit 103 according to the present embodiment, the output impedance conversion ratio $Z_C/Z_L$ of the TLT circuit 130 in the high-power mode is 1/9.

4.2.2 Middle/Low-Power Mode

Figure 10B:
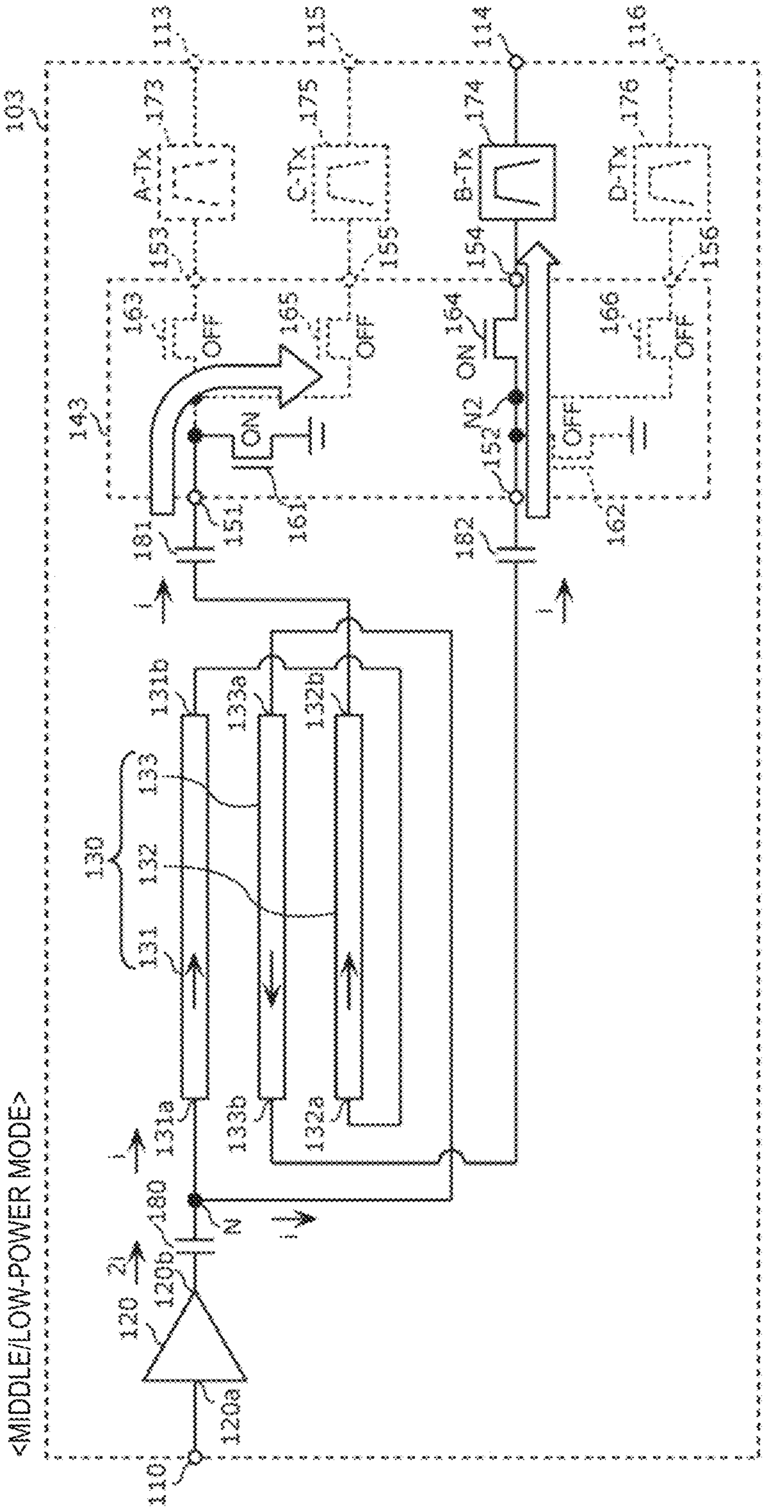
FIG. 10B illustrates current flows in the power amplifier circuit according to the fourth embodiment in operation in a middle/low-power mode.

Next, an operation of the middle/low-power mode will be described with reference to FIG. 10B. FIG. 10B illustrates current flows in the power amplifier circuit 103 in operation in the middle/low-power mode.

As illustrated in FIG. 10B, in the middle/low-power mode, the first switch 161 is turned on, and the second switch 162 is turned off. Since the first switch 161 is turned on, the first terminal 151 is coupled to ground (grounded).

FIG. 10B illustrates an example of amplifying radio-frequency signals in the band B in the middle/low-power mode. In this case, the fourth switch 164 is turned on, and the third switch 163, the fifth switch 165, and the sixth switch 166 are all turned off. At this time, the second terminal 152 and the sixth terminal 156 are in the electrically discontinuous state (open state). The first terminal 151 and each of the third terminal 153 and the fifth terminal 155 are in the electrically discontinuous state (open state).

To amplify radio-frequency signals in the band D, the third switch 163, the fourth switch 164, and the fifth switch 165 are turned off, and the sixth switch 166 is turned on. Assuming the second switch 162 is turned off in the middle/low-power mode, either the fourth switch 164 or the sixth switch 166 is turned on.

As a result, among the transfer lines included in the TLT circuit 130, the third line 133 coupled to the second terminal 152 functions as a main line. The second line 132 and the first line 131 that are coupled to the first terminal 151 (ground) function as a sub-line (shunt line). Thus, the current flowing through the TLT circuit 130 is the same as in the first embodiment. As such, also in the power amplifier circuit 103 according to the present embodiment, the output impedance conversion ratio $Z_C/Z_L$ of the TLT circuit 130 in the middle/low-power mode is 1/4.

Upon switching from the high-power mode to the middle/low-power mode, the output impedance conversion ratio $Z_C/Z_L$ of the TLT circuit 130 increases by a factor of 2.25, from 1/9 to 1/4. As such, the efficiency of the power amplifier circuit 103 increases in the middle/low-power mode.

4.3 Effects

As described above, in the power amplifier circuit 103 according to the present embodiment, the switching circuit 143 further includes the sixth terminal 156 coupled to the second terminal 152, the fourth switch 164 provided between the second terminal 152 and the fourth terminal 154, and the sixth switch 166 provided between the second terminal 152 and the sixth terminal 156.

With this configuration, the third terminal 153, the fourth terminal 154, the fifth terminal 155, and the sixth terminal 156 can be respectively coupled to four different filters. This configuration thus enables amplification of radio-frequency signals in four communication bands with high efficiency.

Modification

Figure 11:
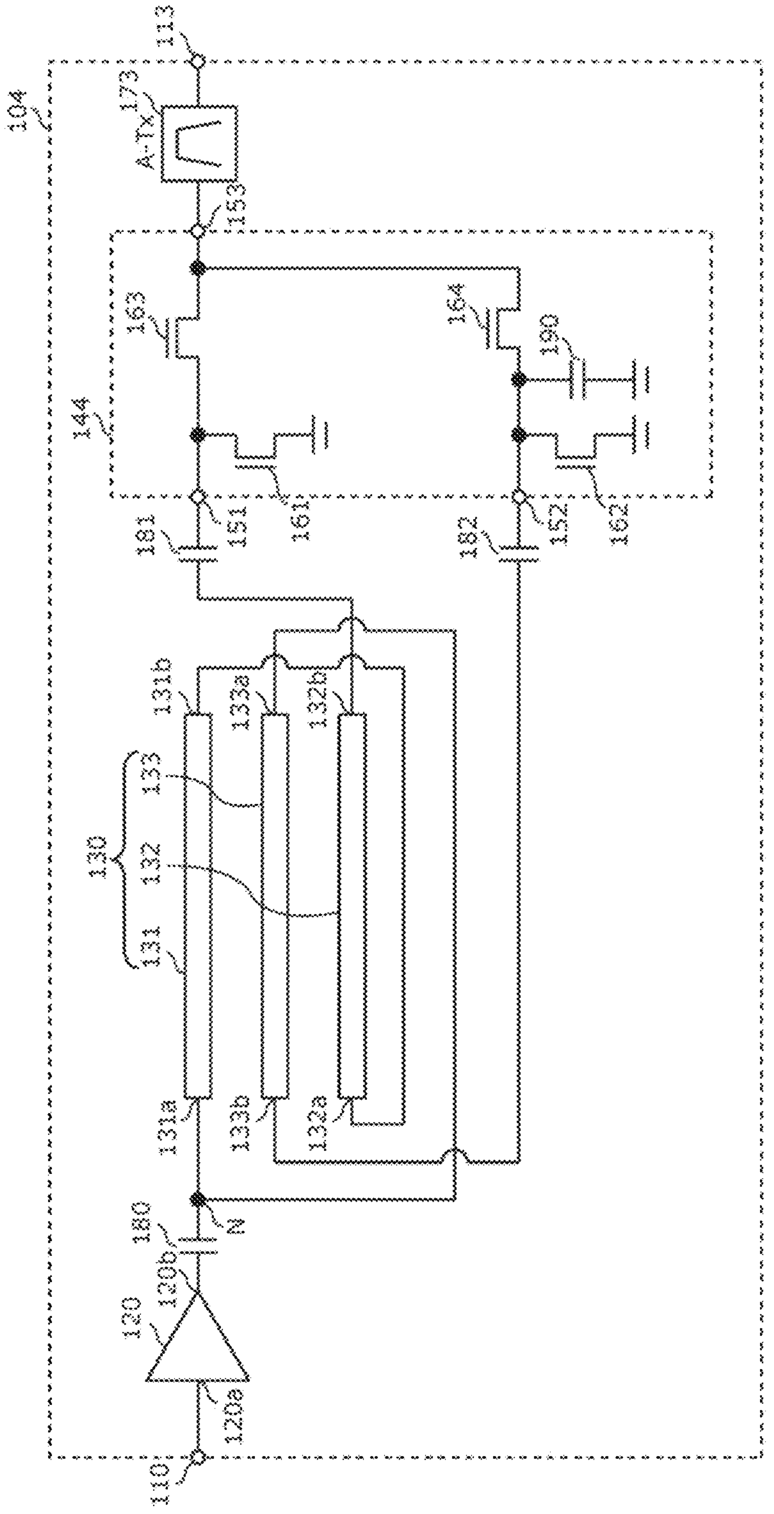
FIG. 11 is a circuit configuration diagram of a power amplifier circuit according to a modification.

Next, a modification of the embodiments described above will be described with reference to FIG. 11. FIG. 11 is a circuit configuration diagram of a power amplifier circuit 104 according to a modification of the embodiments.

As illustrated in FIG. 11, the power amplifier circuit 104 includes a switching circuit 144 in place of the switching circuit 140 in the power amplifier circuit 100 according to the first embodiment. The switching circuit 144 includes a capacitor 190 in addition to the configuration of the switching circuit 140.

The capacitor 190 is a capacitor (shunt capacitor) coupled in series between the second terminal 152 and ground. Specifically, one end of the capacitor 190 is coupled, in the path connecting the second terminal 152 and the fourth switch 164, between the connection point of the second switch 162 to the path and the fourth switch 164. Thus, the capacitor 190 is coupled closer to the fourth switch 164 (the third terminal 153) than the second switch 162.

As described above, the power amplifier circuit 104 according to this modification further includes the capacitor 190, which is coupled in series between the second terminal 152 and ground.

The capacitance component of the main line (the third line 133) of the TLT circuit 130 in the middle/low-power mode is lower than the capacitance component of the main line (the first line 131 and the second line 132) of the TLT circuit 130 in the high-power mode. Thus, as illustrated in FIG. 6, upon switching from the high-power mode to the middle/low-power mode, the output impedance slightly shifts to the inductance region (the upper half of the Smith chart).

Incorporating the capacitor 190 contributes to compensating for the decrease in the capacitance component that can occur in the middle/low-power mode. This configuration inhibits the shift of the output impedance toward the inductance region upon switching from the high-power mode to the middle/low-power mode.

The one end of the capacitor 190 is coupled, in the path connecting the second terminal 152 and the fourth switch 164, between the connection point of the second switch 162 to the path and the fourth switch 164.

With this configuration, compensation is more efficiently provided for the decrease in the capacitance component that can occur in the middle/low-power mode.

The connection location of the capacitor 190 is not limited to the example illustrated in FIG. 11. For example, the capacitor 190 may be coupled, in the path connecting the second terminal 152 and the fourth switch 164, between the switching point of the second switch 162 to the path and the second terminal 152. Alternatively, the capacitor 190 may be directly coupled to the second terminal 152. The capacitor 190 may be provided outside the switching circuit 144. For example, the capacitor 190 may be coupled to the path connecting the capacitor 182 and the second terminal 152.

A shunt capacitor may be coupled in the path connecting the first terminal 151 and the third switch 163. The shunt capacitor may be coupled to the path connecting the capacitor 181 and the first terminal 151, similarly to the capacitor 190.

The foregoing has described the configuration of the power amplifier circuit 100 according to the first embodiment that additionally includes the capacitor 190, with reference to FIG. 11. However, the capacitor 190 may be provided in the power amplifier circuits 101 to 103 according to the second to fourth embodiments. For example, in the switching circuit 141 illustrated in FIG. 4 or the switching circuit 142 illustrated in FIG. 7, the capacitor 190 may be coupled to the path connecting the second terminal 152 and the fourth terminal 154. The capacitor 190 may be directly coupled to the fourth terminal 154. In the switching circuit 143 illustrated in FIG. 9, the capacitor 190 may be coupled to the path connecting the second terminal 152 and the node N2.

The capacitance of the capacitor 190 may differ among the different paths to which the capacitor 190 is coupled. The decrease in the capacitance component that can occur in the middle/low-power mode depends on the frequency of radio-frequency signals. By incorporating the capacitor 190 that matches the magnitude of the decrease in the capacitance component, compensation is more precisely achieved for this decrease in the capacitance component.

The capacitor 190 may be a variable capacitance element such as a digital tunable capacitor (DTC). For example, the capacitance of the capacitor 190 may be changed to suit individual communication bands. With this configuration, compensation is more precisely achieved for the decrease in the capacitance component that can occur in the middle/low-power mode.

Practical Example

Next, a specific practical example of the power amplifier circuits 100 to 104 according to the embodiments and modification will be described with reference to FIGS. 12 and 13.

Figure 12:
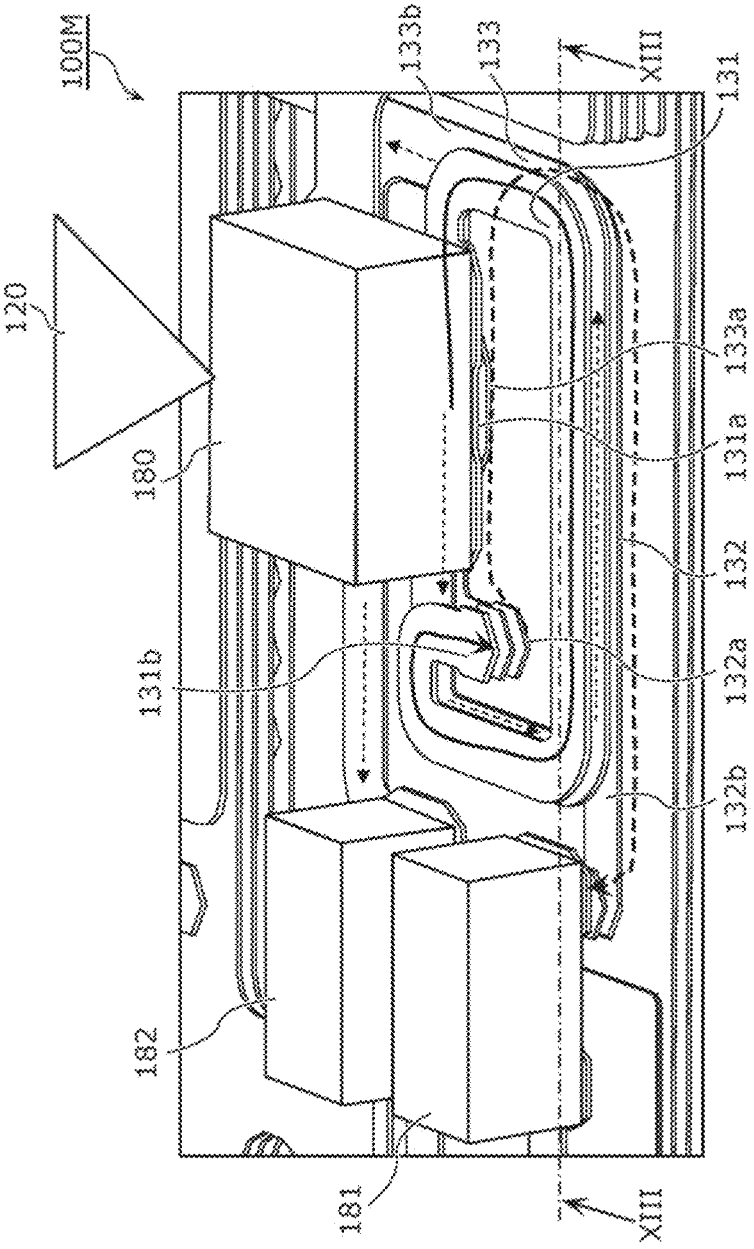
FIG. 12 is a perspective view of a portion of a power amplifier circuit according to a practical example.
Figure 13:
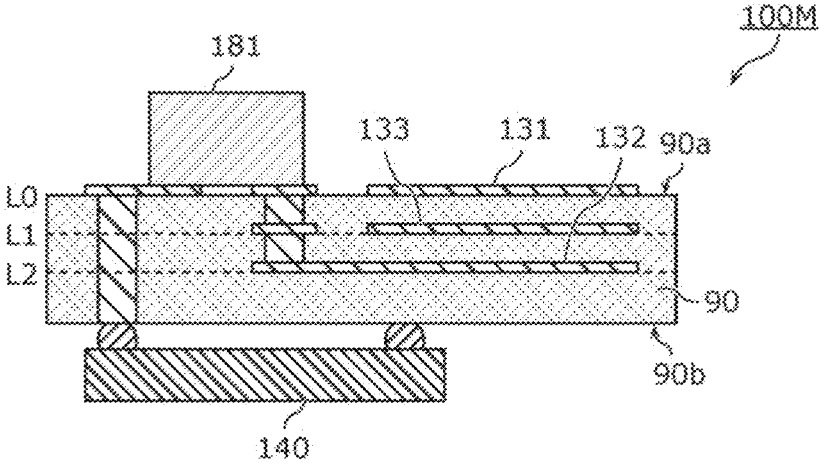
FIG. 13 is a schematic cross-sectional view of the power amplifier circuit according to the practical example.

FIG. 12 is a perspective view of a portion of a power amplifier circuit 100M according to a practical example. FIG. 13 is a schematic cross-sectional view of the power amplifier circuit 100M according to the practical example. Specifically, FIG. 13 illustrates a cross-section at the location indicated by line XIII-XIII in FIG. 12; the cross-section is orthogonal to both major surfaces 90*a* and 90*b* of a module substrate 90. In FIG. 12, the module substrate 90 is not illustrated to allow easy viewing of the line configuration of the TLT circuit 130; the wiring structure provided at the surface of the module substrate 90 or inside the module substrate 90 is schematically illustrated.

The circuit configuration of the power amplifier circuit 100M is identical to the circuit configurations of the power amplifier circuits 100 to 104 according to the embodiments and modification. As illustrated in FIG. 13, the power amplifier circuit 100M according to the practical example includes the module substrate 90.

As the module substrate 90, for example, a low temperature co-fired ceramics (LTCC) substrate or high temperature co-fired ceramics (HTCC) substrate that has a layered structure composed of multiple dielectric layers, a component-embedded substrate, a substrate including a redistribution layer (RDL), or a printed-circuit board can be used. However, these examples are not to be interpreted as limiting.

The module substrate 90 has the major surfaces 90*a* and 90*b*. The major surface 90*a* is an example of a first major surface. The major surface 90*b* is an example of a second major surface. The major surface 90*b* is opposite to the major surface 90*a*.

At the major surface 90*a*, the amplifier element 120 and the capacitors 180, 181, and 182 are disposed. The amplifier element 120, which is represented by a schematic symbol in FIG. 12, is provided, for example, in an integrated circuit (IC) mounted at the major surface 90*a*. The IC is made of, for example, at least one of gallium arsenide (GaAs), silicon germanium (SiGe), and gallium nitride (GaN). The IC may be formed using complementary metal-oxide semiconductor (CMOS). Specifically, the IC may be produced through a silicon-on-insulator (SOI) process. The semiconductor material for the IC is not limited to the materials mentioned above.

The capacitors 180, 181, and 182 are chip capacitors. At least one of the capacitors 180, 181, and 182 may be implemented by an integrated passive device (IPD) rather than a discrete passive component such as a chip capacitor. Alternatively, at least one of the capacitors 180, 181, and 182 may be formed inside an IC or formed using wiring layers in the module substrate 90.

The switching circuit 140 (or any of the switching circuits 141 to 144) is disposed at the major surface 90*b*. The switching circuit 140 is included in an IC. In the case of the switching circuit 144 illustrated in FIG. 11, the capacitor 190 may be included in the IC or may be formed outside the IC.

In this practical example, the capacitors 181 and 182 overlap the switching circuit 140 in plan view. The switching circuit 140 overlaps the TLT circuit 130 in plan view. Specifically, the first line 131, the second line 132, and the third line 133 overlap the switching circuit 140 in plan view.

At least a portion of the TLT circuit 130 is disposed inside the module substrate 90. For example, the third line 133 is positioned inside the module substrate 90, and the third line 133 overlaps the first line 131 and the second line 132 in plan view.

Specifically, the first line 131, the second line 132, and the third line 133 are formed in wiring layers at different heights of the module substrate 90. More specifically, as illustrated in FIG. 13, the first line 131 is disposed above the major surface 90*a* of the module substrate 90, in other words, in a surface layer L0. The second line 132 is disposed in a second layer L2. The third line 133 is disposed in a first layer L1. From the major surface 90*a* to the major surface 90*b*, the surface layer L0, the first layer L1, and the second layer L2 are arranged in the order presented. The first line 131, the second line 132, and the third line 133 are, for example, conductive patterns that are formed in the respective layers by using a metal such as copper.

As illustrated in FIG. 12, the one end 131*a* of the first line 131 and the one end 133*a* of the third line 133 are disposed at the positions that overlap the capacitor 180 in plan view. Specifically, the one end 131*a* of the first line 131 is positioned in the surface layer L0, and the one end 133*a* of the third line 133 is positioned in the first layer L1. The one end 131*a* in the surface layer L0 and the one end 133*a* in the first layer L1 are coupled to each other by a conductive via (not illustrated in the drawing). The upper end of the conductive via corresponds to the node N (see FIG. 2).

In the surface layer L0, as indicated by a solid-line arrow in FIG. 12, the first line 131 forms a rectangular loop, extending clockwise from the one end 131*a*, which overlaps the capacitor 180 in plan view. The other end 131*b* of the first line 131 is positioned inside the rectangular loop. The other end 131*b* is coupled to the one end 132*a* of the second line 132 in the second layer L2 by a conductive via that extends from the surface layer L0 to the second layer L2. The conductive via is not in contact with the third line 133 of the first layer L1.

In the first layer L1, as indicated by dashed-line arrows in FIG. 12, the third line 133 forms a rectangular loop, extending counterclockwise from the one end 133*a*, which overlaps the capacitor 180 in plan view. Assuming the third line 133 is traced counterclockwise, the other end 133*b* of the third line 133 appears first as a portion that does not overlap either the first line 131 or the second line 132 in plan view. In the first layer L1, a wire extends from the other end 133*b* to a position that overlaps the capacitor 182 in plan view. A conductive via is provided at the portion that overlaps the capacitor 182 in plan view to electrically couple the first layer L1 and the capacitor 182.

In the second layer L2, as indicated by a long dashed-line arrow in FIG. 12, the second line 132 forms a rectangular loop, extending clockwise from the one end 132*a*, which overlaps the other end 131*b* of the first line 131 in plan view. Assuming the second line 132 is traced counterclockwise, the other end 132*b* of the second line 132 appears first as a portion that does not overlap either the first line 131 or the third line 133 in plan view. In the second layer L2, a wire extends from the other end 132*b* to a position that overlaps the capacitor 181 in plan view. A conductive via is provided at the portion that overlaps the capacitor 181 in plan view to electrically couple the second layer L2 and the capacitor 181.

As described above, the power amplifier circuit 100M according to this practical example further includes the module substrate 90 that has the major surfaces 90*a* and 90*b*. The amplifier element 120 is disposed at the major surface 90*a*. The switching circuit 140 is disposed at the major surface 90*b*.

This configuration allows the circuit components to be mounted on both sides of the module substrate 90, thereby reducing the area of the module substrate 90.

The third line 133 is positioned inside the module substrate 90, and the third line 133 overlaps the first line 131 and the second line 132 in plan view.

This configuration reduces the area occupied by the TLT circuit 130 in plan view in the module substrate 90. Thus, the layout of the components can be more flexible. Otherwise, the area of the module substrate 90 can be reduced.

The switching circuit 140 overlaps the TLT circuit 130 in plan view.

This configuration shortens the wire length between the TLT circuit 130 and the switching circuit 140.

The first line 131 is not necessarily disposed in the surface layer L0. For example, the TLT circuit 130 may be disposed entirely inside the module substrate 90. Thus, the first line 131, the second line 132, and the third line 133 are formed in wiring layers at different heights within the module substrate 90. The second line 132 may be formed at the major surface 90*b* of the module substrate 90.

The first line 131, the second line 132, and the third line 133 are formed in rectangular loops, but this is not to be interpreted as limiting. The first line 131, the second line 132, and the third line 133 may be formed in circular, L-shaped, or linear shapes. The shape and arrangement are not particularly limited, provided that the first line 131 and the second line 132 can be electromagnetically coupled to the third line 133.

For example, at least two of the first line 131, the second line 132, and the third line 133 may be provided in the same wiring layer. The first line 131, the second line 132, and the third line 133 may all be provided in the same wiring layer. For example, the first line 131, the second line 132, and the third line 133 may be provided at the major surface 90*a* (the surface layer L0) of the module substrate 90, or provided in the first layer L1 or the second layer L2. Alternatively, the first line 131, the second line 132, and the third line 133 may be provided at the major surface 90*b* of the module substrate 90. In these cases, the third line 133 can be provided between the first line 131 and the second line 132. For example, the first line 131, the second line 132, and the third line 133 are provided parallel to each other.

Fifth Embodiment

Next, a fifth embodiment will be described.

A power amplifier circuit according to the fifth embodiment differs from the first embodiment in that the power amplifier circuit according to the fifth embodiment includes a variable impedance circuit in place of the switching circuit. The following primarily describes features that differ from the first embodiment, and descriptions of common features will not be repeated or will be simplified.

5.1 Circuit Configuration of Power Amplifier Circuit 200

Figure 14:
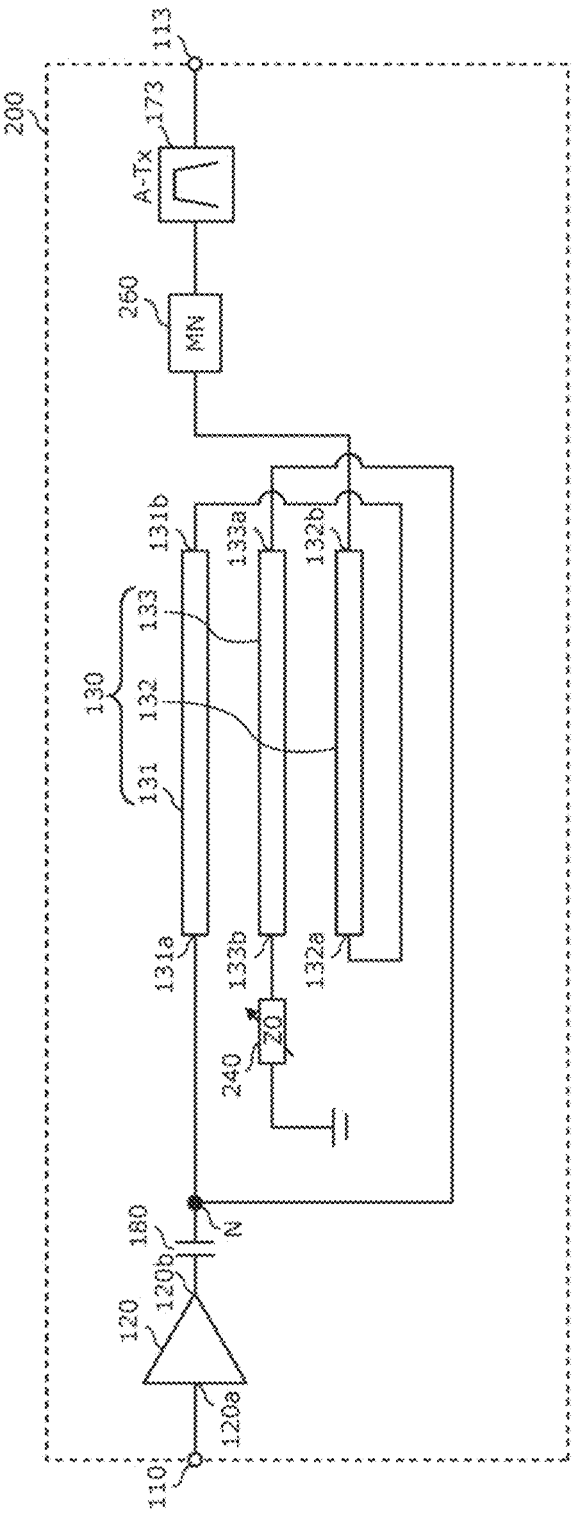
FIG. 14 is a circuit configuration diagram of a power amplifier circuit according to a fifth embodiment.

First, a power amplifier circuit 200 according to the fifth embodiment will be described with reference to FIG. 14. FIG. 14 is a circuit configuration diagram of the power amplifier circuit 200 according to the present embodiment.

The power amplifier circuit 200 illustrated in FIG. 14 includes a variable impedance circuit 240 and a matching circuit 260, without including the switching circuit 140 and the capacitors 181 and 182 in the power amplifier circuit 100 according to the first embodiment.

The variable impedance circuit 240 has a variable impedance Z0. Specifically, the variable impedance circuit 240 includes at least one of elements including a variable inductor, a variable capacitor, and a variable resistor. The impedance Z0 of the variable impedance circuit 240 is variable in accordance with control by a control unit (not illustrated in the drawing) included in the power amplifier circuit 200 or the radio-frequency circuit, or by the RFIC 3. For example, the impedance Z0 of the variable impedance 240 circuit can be changed to suit the individual operating modes.

The variable impedance circuit 240 is coupled between the other end 133*b* of the third line 133 of the TLT circuit 130 and ground. In other words, the other end 133*b* of the third line 133 is coupled to ground via the variable impedance circuit 240.

The matching circuit 260 is provided for impedance matching between the TLT circuit 130 and the filter 173. The matching circuit 260 includes, for example, at least one of a capacitor and an inductor. Similarly to the capacitor 181 according to the first embodiment, the matching circuit 260 is provided for the purpose of cancelling at least a portion of the parasitic inductance component that is generated in the path connecting the other end 132*b* of the second line 132 and the first terminal 151.

The matching circuit 260 is coupled between the other end 132*b* of the second line 132 of the TLT circuit 130 and the filter 173. In other words, the other end 132*b* of the second line 132 is coupled to the external output terminal 113 via the matching circuit 260 and the filter 173. The matching circuit 260 and the filter 173 are not necessarily provided.

In the present embodiment, among the transfer lines included in the TLT circuit 130, the first line 131 and the second line 132 function as a main line, and the third line 133 functions as a sub-line. In the present embodiment, unlike the first to fourth embodiments, the main and sub-lines are fixed and not interchangeable. By changing the impedance Z0 of the variable impedance circuit 240, the impedance conversion ratio $Z_C/Z_L$ of the TLT circuit 130 can be altered.

For example, in the high-power mode, the impedance Z0 of the variable impedance circuit 240 can be reduced to a lower level or to 0. As a result, the current flowing in the third line 133 as the sub-line is increased.

For example, in the middle/low-power mode, the impedance Z0 of the variable impedance circuit 240 can be increased. This configuration decreases the magnitude of the current flowing in the third line 133 as the sub-line, thereby reducing power consumption. For example, this configuration increases the output impedance conversion ratio $Z_C/Z_L$ of the TLT circuit 130, thus increasing the efficiency of the power amplifier circuit 200.

As described above, in the power amplifier circuit 200 according to the present embodiment, the impedance conversion ratio $Z_C/Z_L$ of the TLT circuit 130 alters to suit the individual operating modes. With this configuration, one mode with low current consumption can be selected. As such, this configuration improves the efficiency of power amplification. Additionally, this configuration enables the alteration of the impedance conversion ratio $Z_C/Z_L$ using the variable impedance circuit 240, while maintaining the feature of the TLT circuit 130 as a wide-band circuit. Thus, the power amplifier circuit 200 is implemented with the wide-band feature.

In the present embodiment, for example, the variable impedance circuit 240 and the TLT circuit 130 can be integrated into a single IC element. For example, the variable impedance circuit 240 is implemented by multiple wires and a switching element such as a transistor that are provided in an IC element (for example, the same configuration as a variable impedance circuit 243 in FIG. 15*c* described later). This configuration reduces the size of the power amplifier circuit 200.

Alternatively, the variable impedance circuit 240, the TLT circuit 130, and the amplifier element 120 may be integrated into a single IC element. This configuration further reduces the size of the power amplifier circuit 200.

5.2 Specific Examples of Variable Impedance Circuit

Figure 15A:
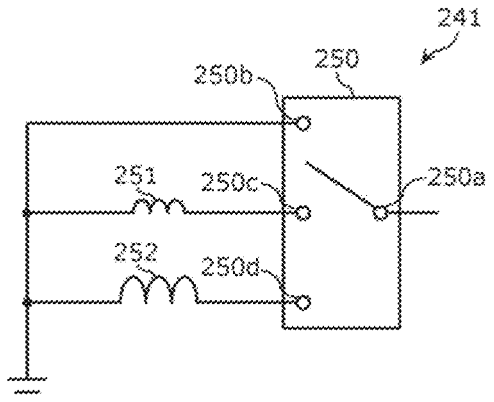
FIG. 15A is a circuit configuration diagram illustrating an example of the variable impedance of the power amplifier circuit according to the fifth embodiment.
Figure 15B:
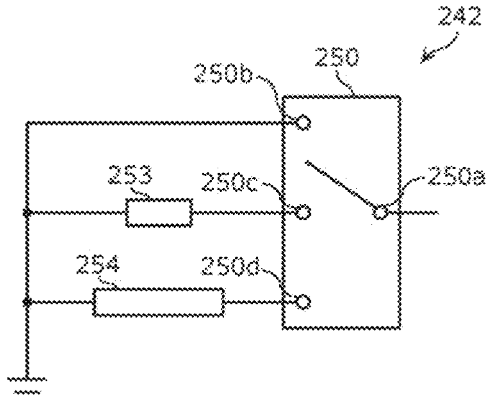
FIG. 15B is a circuit configuration diagram illustrating another example of the variable impedance of the power amplifier circuit according to the fifth embodiment.
Figure 15C:
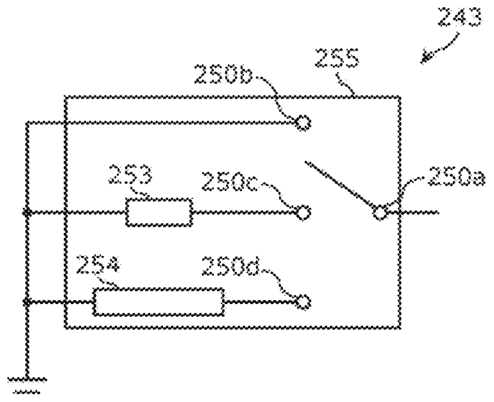
FIG. 15C is a circuit configuration diagram illustrating a further example of the variable impedance of the power amplifier circuit according to the fifth embodiment.

The following describes specific configuration examples of the variable impedance circuit 240 with reference to FIGS. 15*a* to 15*c*. FIGS. 15*a* to 15*c* are circuit configuration diagrams each illustrating an example of the variable impedance of the power amplifier circuit according to the fifth embodiment.

5.2.1. First Example

A variable impedance circuit 241 illustrated in FIG. 15A includes a switch 250 and inductors 251 and 252.

The switch 250 has a common terminal 250*a* and selection terminals 250*b*, 250*c*, and 250*d*. The switch 250 is operable to control connection (electrical continuity) and disconnection (electrical discontinuity) between the common terminal 250*a* and each of the selection terminals 250*b*, 250*c*, and 250*d*. Although not illustrated in the drawing, the common terminal 250*a* is coupled to the other end 133*b* of the third line 133. The selection terminal 250*b* is directly coupled to ground. The selection terminal 250*c* is coupled to ground via the inductor 251. The selection terminal 250*d* is coupled to ground via the inductor 252.

The switch 250 is a single-pole triple-throw (SP3T) switching circuit. The switch 250 may be a multi-connection switching circuit. Thus, the common terminal 250*a* may be simultaneously coupled to two or more of the selection terminals 250*b*, 250*c* and 250*d*. The switch 250 is implemented as, for example, an IC element.

The inductor 251 is coupled between the selection terminal 250*c* and ground. The inductor 252 is coupled between the selection terminal 250*d* and ground. The inductors 251 and 252 are, for example, chip inductors. The inductance of the inductor 251 is lower than the inductance of inductor 252.

An inductor may also be coupled between the selection terminal 250*b* and ground. The inductance of the inductor in this case differs from both the inductors 251 and 252.

The switch 250 is able to change the impedance Z0 (inductance in this example) of the variable impedance circuit 241 by changing the connection destination of the common terminal 250*a*. With this configuration, for example, the impedance can be set to a level that suites the individual operating modes. This configuration thus reduces current consumption and improves the efficiency of power amplification in low-power operating modes such as the middle/low-power mode.

The number of selection terminals included in the switch 250 may be two, or four or more. In place of the inductors 251 and 252, two capacitors with different capacitances may be provided. A capacitor may also be provided between the selection terminal 250*b* and ground. Capacitors may be individually coupled to the inductors 251 and 252. The type of impedance element coupled between each selection terminal of the switch 250 and ground is not particularly limited.

5.2.2. Second Example

A variable impedance circuit 242 illustrated in FIG. 15B includes a switch 250 and wires 253 and 254. The configuration of the switch 250 is identical to the switch 250 illustrated in FIG. 15A.

In the variable impedance circuit 242, the wires 253 and 254 are provided in place of the inductors 251 and 252. In other words, the parasitic inductances of the wires 253 and 254 that couple the respective selection terminals 250*c* and 250*d* to ground are used as inductors. The wires 253 and 254 have, for example, different wire lengths. Alternatively, the wires 253 and 254 may have different wire widths. The wires 253 and 254 may differ from each other with respect to layout.

As described above, the variable impedance circuit 242 is implemented by using the parasitic inductances of wires, without using circuit elements (components) such as chip inductors. This configuration eliminates the need to mount circuit elements, thereby simplifying the manufacturing process and reducing the size of the circuit.

A portion of the wires 253 and 254 may be used as electrodes of a capacitor. Specifically, assuming the variable impedance circuit includes a capacitor, the capacitor may or may not be a chip capacitor; the parasitic capacitance generated using a portion of the wires may function as the capacitor.

5.2.3. Third Example

A variable impedance circuit 243 illustrated in FIG. 15C includes a switch 255 and wires 253 and 254.

The switch 255 has a common terminal 250*a* and selection terminals 250*b*, 250*c*, and 250*d*. The connections between the selection terminals 250*b*, 250*c*, and 250*d* and the wires 253 and 254 are identical to the connections in the variable impedance circuit 242 illustrated in FIG. 15B. The operation of the switch 255 is identical to the operation of the switch 250.

In the variable impedance circuit 243, the switch 255 is implemented by an IC element that includes the wires 253 and 254. In other words, the wires in the IC element that implements the switch 255 are used as the wires 253 and 254. This configuration reduces the size of the variable impedance circuit 243.

5.3 Effects

As described above, the power amplifier circuit 200 according to the present embodiment includes the amplifier element 120, the TLT circuit 130 including the first line 131, the second line 132, and the third line 133, and the variable impedance circuit 240. The one end 131*a* of the first line 131 is coupled to the output terminal 120*b* of the amplifier element 120. The other end 131*b* of the first line 131 is coupled to the one end 132*a* of the second line 132. The one end 133*a* of the third line 133 is coupled between the one end 131*a* of the first line 131 and the output terminal 120*b* of the amplifier element 120. The other end 133*b* of the third line 133 is coupled to ground via the variable impedance circuit 240.

With this configuration, by changing the impedance Z0 of the variable impedance circuit 240, the impedance conversion ratio $Z_C/Z_L$ of the TLT circuit 130 can be altered. For example, with this configuration, one operating mode with low current consumption can be selected. As such, this configuration improves the efficiency of the power amplifier circuit 200.

Others

The power amplifier circuit and the power amplification method according to the present disclosure have been described based on the embodiments, modification, and practical example. However, the present disclosure is not limited to the embodiments described above.

For example, the preceding discussion has described the example in which the power amplifier circuits according to the embodiments have operating modes that correspond to output power levels. However, this is not to be interpreted as limiting. For example, the power amplifier circuits may have operating modes that correspond to communication bands. For example, to amplify radio-frequency signals in a first band (for example, Band B41), the power amplifier circuit 101 according to the second embodiment may turn off the first switch 161 and turn on the second switch 162. To amplify radio-frequency signals in a second band (for example, Band B7) that is different from the first band, the power amplifier circuit 101 according to the second embodiment may turn on the first switch 161 and turn off the second switch 162. The second band corresponds to a frequency range that is higher than the first band. However, this is not to be interpreted as limiting.

For example, in the power amplifier circuit 100 according to the first embodiment, the switching circuit 140 may include multiple third terminals 153. In this case, the third terminals 153 can be individually coupled to both the first terminal 151 and the second terminal 152. A switch (series switch) can be provided between each third terminal 153 and the first terminal 151. A switch (series switch) can be provided between each third terminal 153 and the second terminal 152. Filters for passing different communication bands can be coupled to the respective third terminals 153 outside the switching circuit 140. This configuration enables interchanging of the main line and the sub-line of the TLT circuit 130 to suit individual output power levels assuming radio-frequency signals in the same communication band are amplified. This interchanging of the main line and the sub-line increases efficiency.

For example, regarding the power amplifier circuits according to the embodiments and modification, 4G-LTE bands are used as an example of the bands A to D. However, this is not to be interpreted as limiting. The bands A to D may be 5GNR communication bands. Specific combinations of the bands A to D are not limited to the examples described above.

For example, the specific configuration of the switching circuit is not particularly limited, provided that the specific configuration allows interchanging of the main line and the sub-line (shunt line) of the TLT circuit 130.

For example, the preceding discussion has described the example in which the power amplifier circuit according to the modification is formed by a double-sided mounting module that has circuit components on both sides of a module substrate. However, this is not to be interpreted as limiting. The power amplifier circuit may be formed by a single-sided mounting module that has circuit components at one major surface or inside a module substrate.

The present disclosure may also be embodied in other forms that can be achieved by applying various modifications to the above-described embodiments that occur to those skilled in the art, or by combining the constituent elements and functions in the embodiments in any manner without departing from the spirit and scope of the present disclosure.

INDUSTRIAL APPLICABILITY

The present disclosure can be used as a multiband power amplifier circuit or the like that is provided at the front-end in a wide variety of communication devices such as mobile phones.

REFERENCE SIGNS LIST

1 radio-frequency circuit
2 antenna
3 RFIC
4 BBIC
5 communication device
11 antenna connection terminal
12 radio-frequency input terminal
90 module substrate
90*a*, 90*b* major surface
100, 100M, 101, 102, 103, 104, 200 power amplifier circuit
110 external input terminal
113, 114, 115, 116 external output terminal
120 amplifier element
120*a* input terminal
120*b* output terminal
130 TLT circuit
131 first line
131*a*, 132*a*, 133*a* one end
131*b*, 132*b*, 133*b* other end
132 second line
133 third line
140, 141, 142, 143, 144 switching circuit
151 first terminal
152 second terminal
153 third terminal
154 fourth terminal
155 fifth terminal
156 sixth terminal
161 first switch
162 second switch
163 third switch
164 fourth switch
165 fifth switch
166 sixth switch
173, 174, 175, 176 filter
180, 181, 182, 190 capacitor
240, 241, 242, 243 variable impedance circuit
250, 255 switch
250*a* common terminal
250*b*, 250*c*, 250*d* selection terminal
251, 252 inductor
253, 254 wire
260 matching circuit

The invention claimed is:

1. A power amplifier circuit comprising:
an amplifier element;
a transmission line transformer (TLT) circuit including a first line, a second line, and a third line; and
a switching circuit including a first terminal, a second terminal, and a third terminal, wherein
one end of the first line is coupled to an output terminal of the amplifier element,
another end of the first line is coupled to one end of the second line,
another end of the second line is coupled to the first terminal,
one end of the third line is coupled between the one end of the first line and the output terminal of the amplifier element,
another end of the third line is coupled to the second terminal,
the third terminal is configured to be coupled to at least one of the first terminal and the second terminal, and
the switching circuit includes
a first switch provided between the first terminal and ground, and
a second switch provided between the second terminal and ground.

2. The power amplifier circuit according to claim 1, wherein the third terminal is configured to be selectively coupled to the first terminal or the second terminal, and the switching circuit further includes a third switch provided between the first terminal and the third terminal, and a fourth switch provided between the second terminal and the third terminal.

3. The power amplifier circuit according to claim 1, wherein the switching circuit further includes a fourth terminal, the third terminal is configured to be coupled to the first terminal, and the fourth terminal is configured to be coupled to the second terminal.

4. The power amplifier circuit according to claim 3, wherein the third terminal is configured to be directly coupled to the first terminal, and the fourth terminal is configured to be directly coupled to the second terminal.

5. The power amplifier circuit according to claim 3, wherein the switching circuit further includes a fifth terminal configured to be coupled to the first terminal, a third switch provided between the first terminal and the third terminal, and a fifth switch provided between the first terminal and the fifth terminal.

6. The power amplifier circuit according to claim 5, wherein the fourth terminal is configured to be directly coupled to the second terminal.

7. The power amplifier circuit according to claim 5, wherein the switching circuit further includes a sixth terminal configured to be coupled to the second terminal, a fourth switch provided between the second terminal and the fourth terminal, and a sixth switch provided between the second terminal and the sixth terminal.

8. The power amplifier circuit according to claim 7, further comprising a capacitor coupled in series between the second terminal and ground, wherein one end of the capacitor is coupled, in a path connecting the second terminal and the fourth switch, between a connection point of the second switch to the path and the fourth switch.

9. The power amplifier circuit according to claim 7, further comprising a capacitor coupled in series between the second terminal and ground.

10. The power amplifier circuit according to claim 9, further comprising:

a first capacitor coupled in series between the other end of the second line and the first terminal; and a second capacitor coupled in series between the other end of the third line and the second terminal.

11. The power amplifier circuit according to claim 10, further comprising a module substrate having a first major surface and a second major surface, the second major surface being opposite to the first major surface, wherein the amplifier element is disposed at the first major surface, the switching circuit is disposed at the second major surface, and the first capacitor and the second capacitor are disposed at the first major surface, and the first capacitor and the second capacitor overlap the switching circuit in plan view.

12. The power amplifier circuit according to claim 10, further comprising a module substrate having a first major surface and a second major surface, the second major surface being opposite to the first major surface, wherein the amplifier element is disposed at the first major surface, and the switching circuit is disposed at the second major surface.

13. The power amplifier circuit according to claim 12, wherein the third line is positioned inside the module substrate, and the third line overlaps the first line and the second line in plan view.

14. The power amplifier circuit according to claim 13, wherein the switching circuit overlaps the TLT circuit in plan view.

15. The power amplifier circuit according to claim 1, wherein the switching circuit is configured to in a first power mode that corresponds to first output power, turn off the first switch and turn on the second switch, and in a second power mode that corresponds to second output power lower than the first output power, turn off the second switch and turn on the first switch.

16. A power amplification method comprising switching between a first mode and a second mode and performing the first mode or the second mode, the first mode being configured such that, using a transmission line transformer (TLT) circuit that includes a first line with one end coupled to an output terminal of the amplifier element, a second line with one end coupled to another end of the first line, and a third line with one end coupled between the one end of the first line and the output terminal of the amplifier element, while another end of the third line is coupled to ground, the amplifier element amplifies a radio-frequency signal, and the amplified radio-frequency signal is output from another end of the second line, the second mode being configured such that, while the other end of the second line is coupled to ground, the amplifier element amplifies a radio-frequency signal, and the amplified radio-frequency signal is output from the other end of the third line.

17. The power amplifier circuit according to claim 12, wherein the switching circuit overlaps the TLT circuit in plan view.

18. The power amplifier circuit according to claim 2, further comprising a capacitor coupled in series between the second terminal and ground, wherein one end of the capacitor is coupled, in a path connecting the second terminal and the fourth switch, between a connection point of the second switch to the path and the fourth switch.

19. The power amplifier circuit according to claim 1, further comprising a capacitor coupled in series between the second terminal and ground.

20. The power amplifier circuit according to claim 6, further comprising a capacitor coupled in series between the second terminal and ground.

* * * * *